(12) United States Patent
Azumada

(10) Patent No.: US 9,087,949 B2
(45) Date of Patent: Jul. 21, 2015

(54) SOLAR CELL MODULE AND SOLAR POWER GENERATION APPARATUS

(75) Inventor: Kyohko Azumada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 107 days.

(21) Appl. No.: 13/988,645

(22) PCT Filed: Nov. 7, 2011

(86) PCT No.: PCT/JP2011/075607
§ 371 (c)(1),
(2), (4) Date: May 30, 2013

(87) PCT Pub. No.: WO2012/070374
PCT Pub. Date: May 31, 2012

(65) Prior Publication Data
US 2013/0233372 A1    Sep. 12, 2013

(30) Foreign Application Priority Data

Nov. 22, 2010  (JP) ................ 2010-260579

(51) Int. Cl.
H02N 6/00    (2006.01)
H01L 31/042  (2014.01)
(Continued)

(52) U.S. Cl.
CPC .......... H01L 31/055 (2013.01); H01L 31/0547 (2014.12); *G02B 6/0015* (2013.01); *G02B 6/0023* (2013.01); *Y02B 10/12* (2013.01); *Y02E 10/52* (2013.01)

(58) Field of Classification Search
CPC ....................................... H01L 31/055
USPC ................................. 136/247, 257
See application file for complete search history.

(56) References Cited

U.S. PATENT DOCUMENTS 6,689,949 B2 *  2/2004  Ortabasi ................ 136/246
2009/0056791 A1 *  3/2009  Pfenninger et al. ...... 136/247
(Continued)

FOREIGN PATENT DOCUMENTS

JP    61-136559 U    8/1986
JP    06-037343 A    2/1994
(Continued)

OTHER PUBLICATIONS

Official Communication issued in International Patent Application No. PCT/JP2011/075607, mailed on Dec. 6, 2011.

*Primary Examiner* — Eli Mekhlin
(74) *Attorney, Agent, or Firm* — Keating & Bennett, LLP

(57) ABSTRACT

A solar cell module includes a plurality of electric power generation units. Each of the plurality of electric power generation units includes a solar cell element and a light guide unit having a first surface and a second surface positioned opposite to the first surface and configured to guide light toward the solar cell element between the first surface and the second surface. The plurality of the light guide units included in the plurality of electric power generation units include a first light guide unit having a first fluorescent material that emits first light upon receipt of light incident from the first surface, and also includes at least one light guide unit of a second light guide unit having a second fluorescent material that emits second light having a different wavelength from the first light upon receipt of light incident from the first surface and a third light guide unit in which a shape of the second surface is designed so that part of light incident from the first surface is reflected from the second surface and travels in a direction non-parallel to that before reflection.

13 Claims, 14 Drawing Sheets

(51) Int. Cl.
*H01L 31/055* (2014.01)
*H01L 31/054* (2014.01)
*F21V 8/00* (2006.01)

(56) References Cited

U.S. PATENT DOCUMENTS

2009/0120488 A1* 5/2009 Gorog et al. .................. 136/247
2009/0126792 A1* 5/2009 Gruhlke et al. ............... 136/259
2010/0043880 A1* 2/2010 Bhaumik et al. .............. 136/257
2010/0180932 A1* 7/2010 Wang et al. ................... 136/246
2010/0278480 A1* 11/2010 Vasylyev ........................ 385/33

FOREIGN PATENT DOCUMENTS

| JP | 08-107230 A | 4/1996 |
| JP | 2009-117446 A | 5/2009 |
| JP | 2010-263115 A | 11/2010 |
| WO | WO 2010023657 A2 * | 3/2010 |

* cited by examiner

SOLAR CELL MODULE AND SOLAR POWER GENERATION APPARATUS

TECHNICAL FIELD

The present invention relates to a solar cell module and a solar power generation apparatus.

The present application claims priority based on Japanese Patent Application No. 2010-260579, filed in Japan on Nov. 22, 2010, the content of which is incorporated herein by reference.

BACKGROUND ART

General solar power generation apparatuses have a form in which a plurality of solar cell panels are installed over a surface so as to be oriented toward the sun. A solar cell apparatus of this type is placed, for example, on the roof, exterior wall, or the like of a building. For example, as disclosed in PTL 1, there is also a solar power generation apparatus which can be used as a window.

The solar power generation apparatus in PTL 1 includes a light guide unit having a fluorescent material dispersed therein, and a solar cell element. The light guide unit has a light receiving surface on which light is incident, and an end surface oriented in a direction different from the light receiving surface. The solar cell element is located on the end surface of the light guide unit. The fluorescent material in the light guide unit emits fluorescent light upon receipt of light incident from the light receiving surface. The solar cell element receives on the light receiving surface, such as a semiconductor layer, the fluorescent light propagating in the light guide unit toward the end surface, and generates electric power.

CITATION LIST

Patent Literature

PTL 1: Japanese Unexamined Utility Model Registration Application Publication No. 61-136559

SUMMARY OF INVENTION

Technical Problem

In a solar power generation apparatus having one type of light guide unit, for example, the one in PTL 1, light that has passed through the light guide unit has one color corresponding to the fluorescent material. Thus, the solar power generation apparatus might be limited to being placed in a location where there will be no problem if light colored with one color is viewed. Aspects of the present invention have been made in view of the foregoing situation, and it is one of the objects thereof to provide a solar cell module and a solar power generation apparatus which can be placed in various locations.

Solution to Problem

A solar cell module according to a first aspect of the present invention includes a plurality of electric power generation units, each of the plurality of electric power generation units including a solar cell element and a light guide unit having a first surface and a second surface positioned opposite to the first surface and configured to guide light toward the solar cell element between the first surface and the second surface, the plurality of light guide units included in the plurality of electric power generation units including a first light guide unit having a first fluorescent material that emits first light upon receipt of light incident from the first surface, and at least one light guide unit of a second light guide unit having a second fluorescent material that emits second light having a different wavelength from the first light upon receipt of light incident from the first surface and a third light guide unit in which a shape of the second surface is designed so that part of light incident from the first surface is reflected from the second surface and travels in a direction non-parallel to that before reflection.

In the first aspect, the plurality of solar cell elements included in the plurality of electric power generation units may have different spectral sensitivities in accordance with a wavelength of light guided in the light guide unit of each of the electric power generation units.

In the first aspect, at least one of the first fluorescent material and the second fluorescent material may absorb ultraviolet radiation and emit light.

In the first aspect, the plurality of electric power generation units may include a pair of electric power generation units arranged adjacent to each other so that the first surfaces are oriented in the same direction.

In the first aspect, the pair of electric power generation units may be arranged so that one side of the first surface of one of the electric power generation units is adjacent to one side of the first surface of the other electric power generation unit, a periphery of each of the first surfaces having a substantially polygonal shape.

In the first aspect, the first surface of the light guide unit in one electric power generation unit of the pair of electric power generation units may include a first flat surface, and the first surface of the light guide unit in the other electric power generation unit of the pair of electric power generation units may include a second flat surface parallel to the first flat surface.

In the first aspect, the first surface of the light guide unit in one electric power generation unit of the pair of electric power generation units may include a first flat surface, and the first surface of the light guide unit in the other electric power generation unit of the pair of electric power generation units may include a second flat surface non-parallel to the first flat surface.

In the first aspect, the first light guide unit may include a main body unit having light transmission properties, and a fluorescent layer disposed on a surface of the main body unit and containing the first fluorescent material.

The solar cell module according to the first aspect may include one or more protective layers having light transmission properties and disposed on a surface of one or more light guide units among the plurality of light guide units.

According to a second aspect of the present invention, there is provided a solar power generation apparatus including a solar cell module according to an aspect of the present invention.

Advantageous Effects of Invention

According to an aspect of the present invention, there can be provided a solar cell module and a solar power generation apparatus which can be placed in various locations.

DESCRIPTION OF EMBODIMENTS

Embodiments will be described hereinafter with reference to the drawings. The requirements in the following embodiments or modifications can be used in combination, if necessary. In addition, one or more of the components described in the embodiments may not necessarily be used.

First Embodiment

Figure 1:
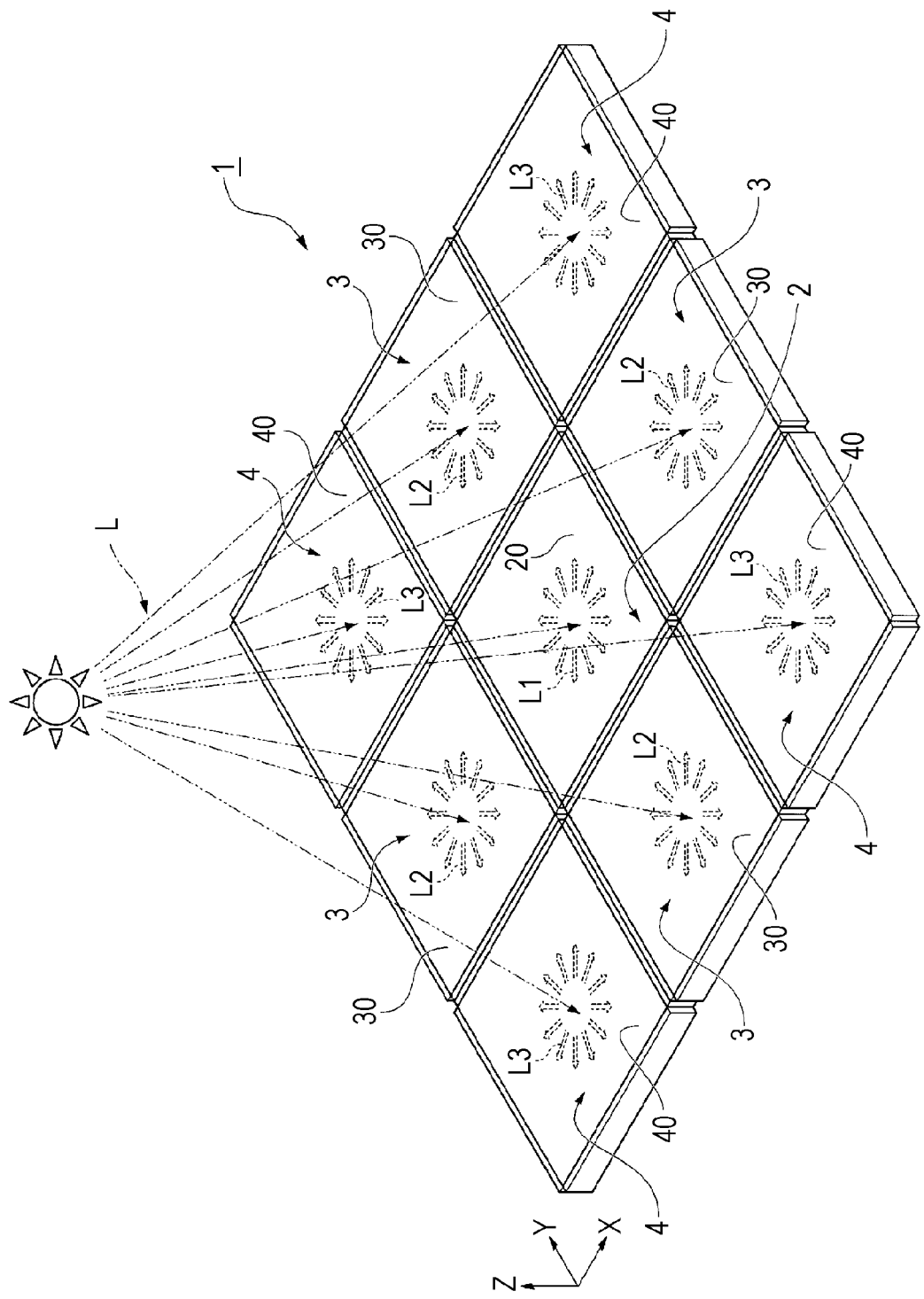
FIG. 1 is a perspective view of a solar cell module according to a first embodiment.
Figure 2:
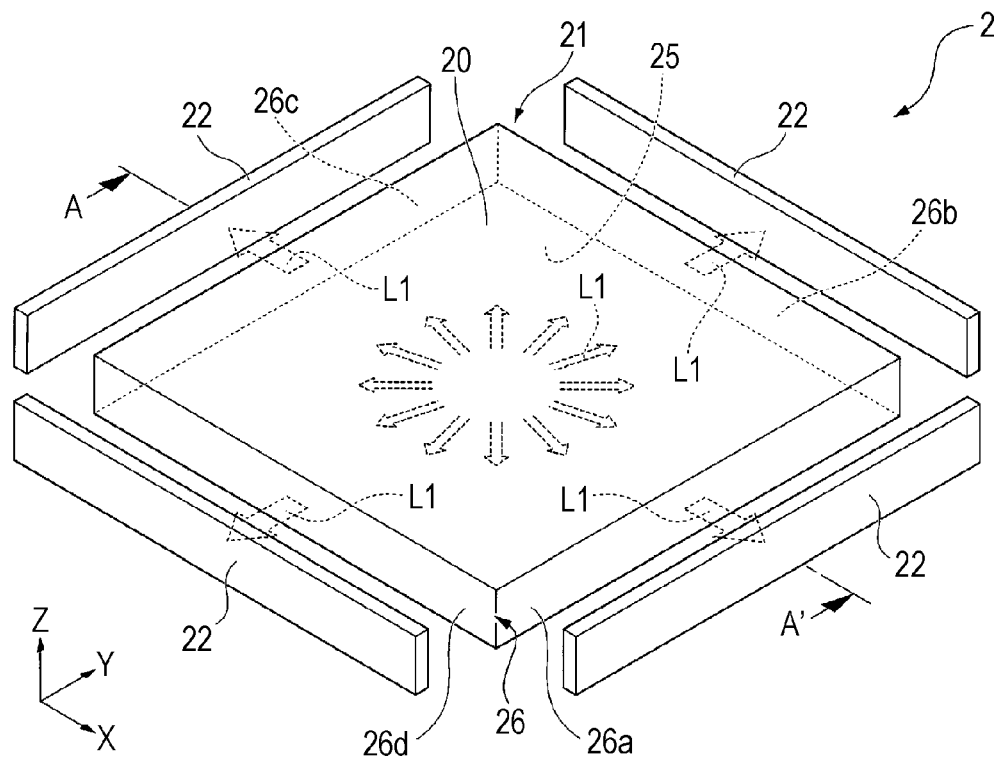
FIG. 2 is an exploded perspective view of a first electric power generation unit according to the first embodiment.
Figure 3:
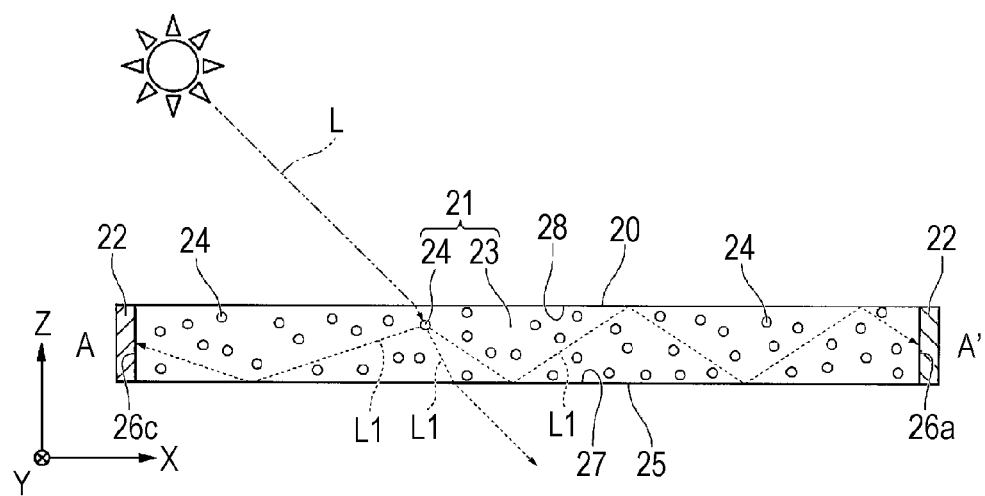
FIG. 3 is a cross-sectional schematic view of the first electric power generation unit according to the first embodiment.
Figure 4:
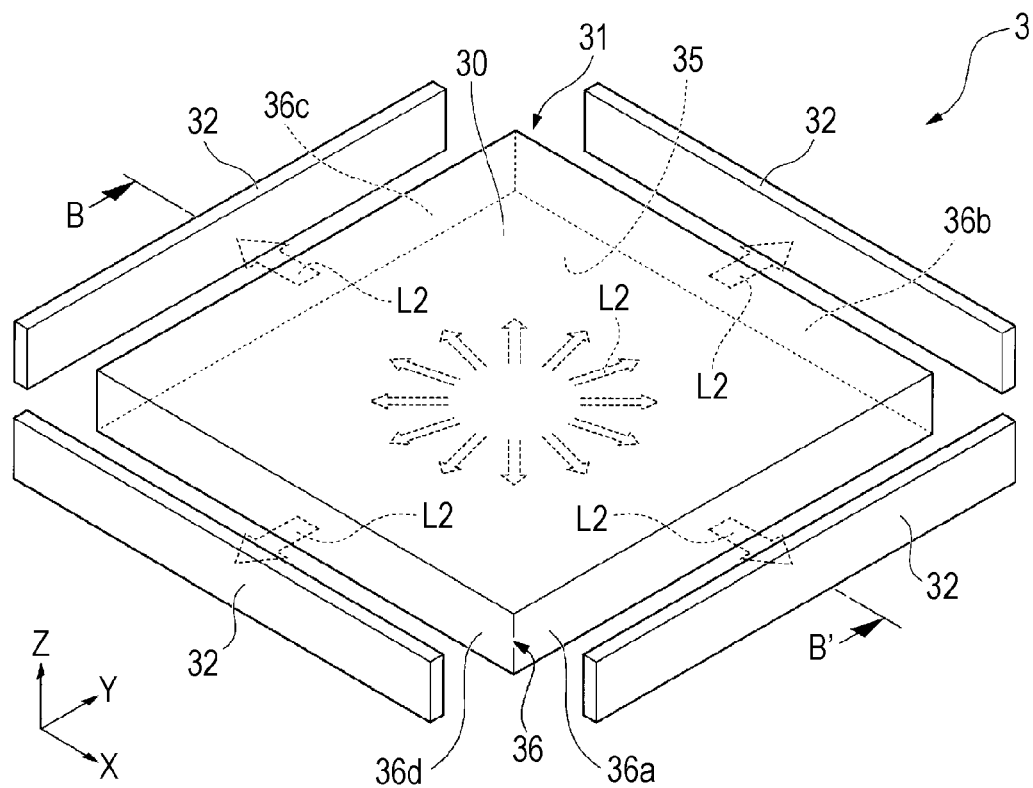
FIG. 4 is an exploded perspective view of a second electric power generation unit according to the first embodiment.
Figure 5:
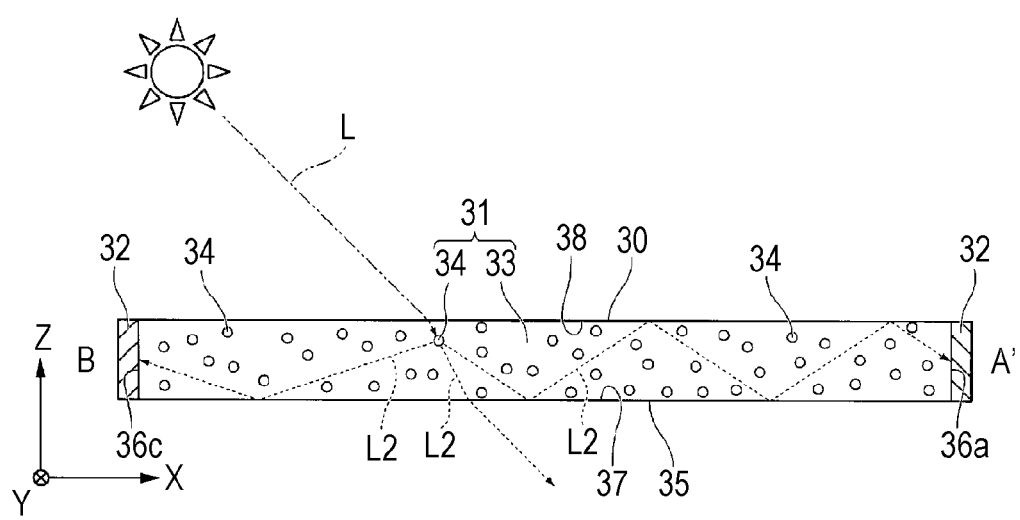
FIG. 5 is a cross-sectional schematic view of the second electric power generation unit according to the first embodiment.
Figure 6:
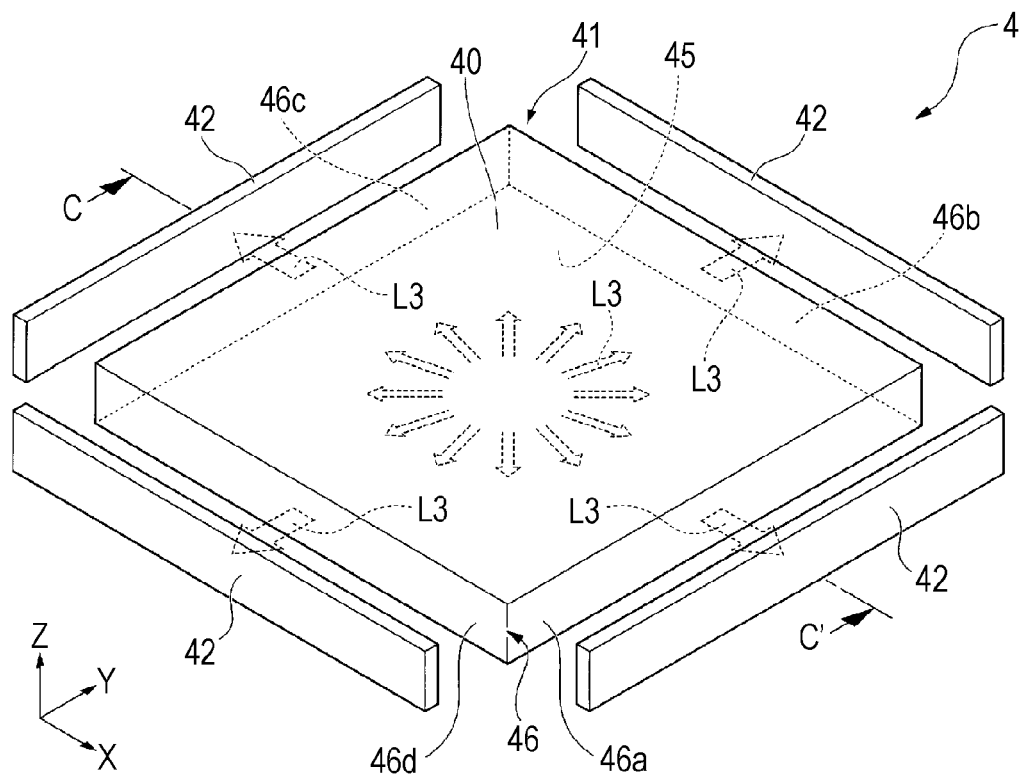
FIG. 6 is an exploded perspective view of a third electric power generation unit according to the first embodiment.
Figure 7:
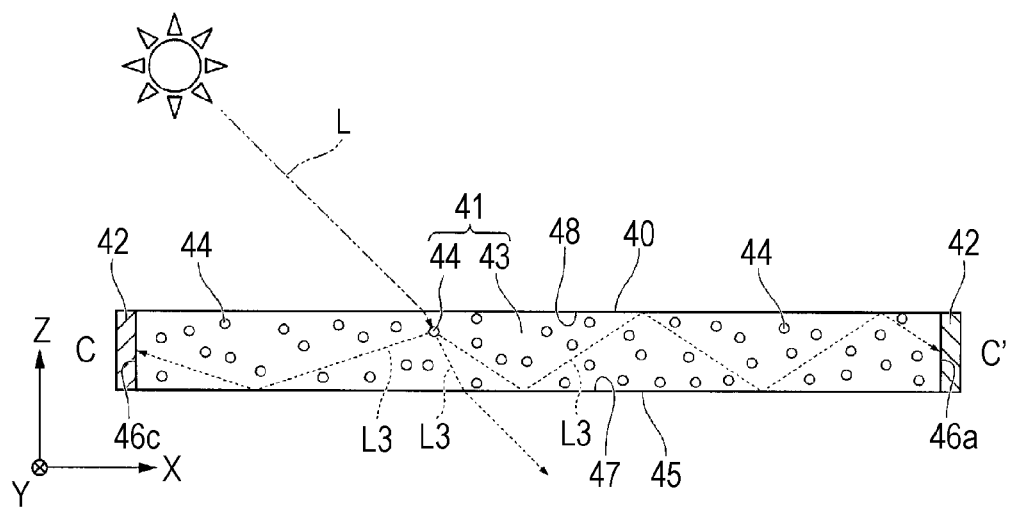
FIG. 7 is a cross-sectional schematic view of the third electric power generation unit according to the first embodiment.
Figure 8:
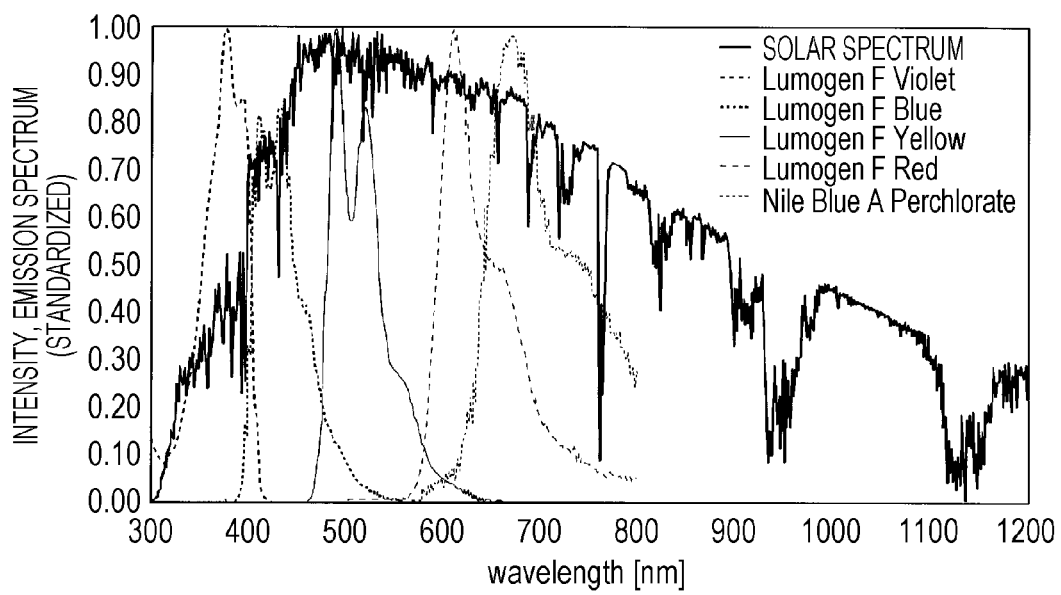
FIG. 8 is a graph illustrating the spectrum of sunlight and the emission spectra of a plurality of kinds of fluorescent substances.
Figure 9:
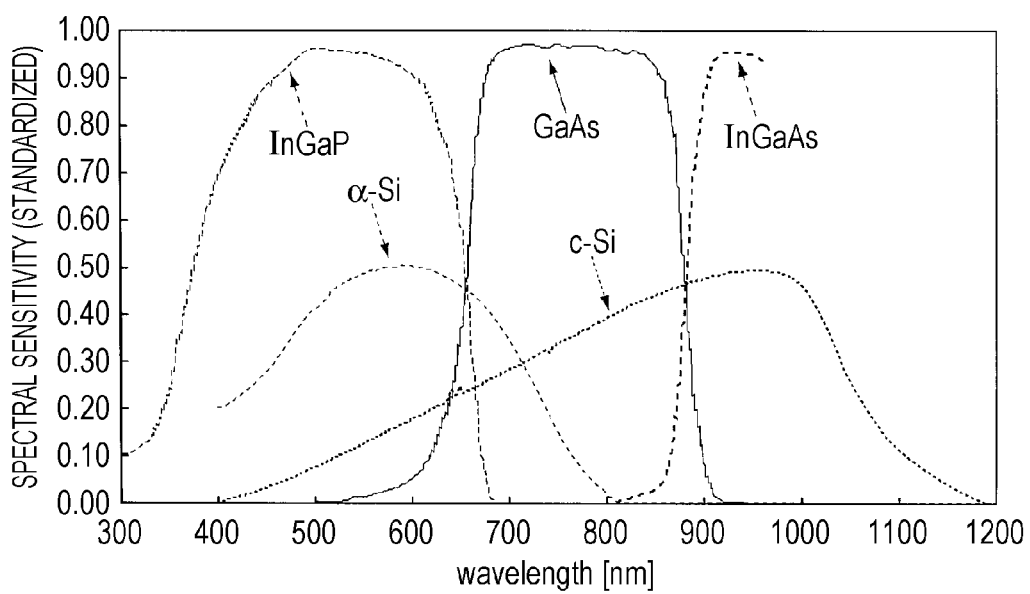
FIG. 9 is a graph illustrating the spectral sensitivities of a plurality of kinds of solar cell elements.

A first embodiment will be described. FIG. 1 is a perspective view of a solar cell module according to the first embodiment. FIG. 2 is an exploded perspective view of a first electric power generation unit. FIG. 3 is a cross-sectional schematic view taken along the line A-A' in FIG. 2. FIG. 4 is an exploded perspective view of a second electric power generation unit. FIG. 5 is a cross-sectional schematic view taken along the line B-B' in FIG. 2. FIG. 6 is an exploded perspective view of a third electric power generation unit. FIG. 7 is a cross-sectional schematic view taken along the line C-C' in FIG. 6. FIG. 8 is a graph illustrating the spectrum of sunlight and the emission spectra of a plurality of kinds of fluorescent materials. FIG. 9 is a graph illustrating the spectral sensitivities of a plurality of kinds of solar cell elements.

A solar cell module 1 according to this embodiment illustrated in FIG. 1 is capable of generating electric power upon receipt of light L such as sunlight incident on the solar cell module 1 from outside. The solar cell module 1 according to this embodiment includes a plurality of electric power generation units including a first electric power generation unit 2, a second electric power generation unit 3, and a third electric power generation unit 4.

The first electric power generation unit 2 has a first surface 20. The first electric power generation unit 2 converts part of the light L incident on the first surface 20 into first light L1, and generates electric power by the first light L1 obtained through conversion. The second electric power generation unit 3 has a first surface 30. The second electric power generation unit 3 converts part of the light L incident on the first surface 30 into second light L2 having a wavelength different from the first light L1. The second electric power generation unit 3 generates electric power by the second light L2 obtained through conversion. The third electric power generation unit 4 has a first surface 40. The third electric power generation unit 4 converts part of the light L incident on the first surface 40 into third light L3 having a wavelength different from the first light L1 and the second light L2. The third electric power generation unit 4 generates electric power by the third light L3 obtained through conversion.

In this embodiment, the first electric power generation unit 2, the second electric power generation unit 3, and the third electric power generation unit 4 are shaped into rectangular plates having similar shapes and dimensions. In this embodiment, the first electric power generation unit 2, the second electric power generation unit 3, and the third electric power generation unit 4 are arranged in two orthogonal directions.

The first electric power generation unit 2 may be different from the second electric power generation unit 3 in at least one of shape and dimensions. The third electric power generation unit 4 may be different from at least one of the first electric power generation unit 2 and the second electric power generation unit 3 in at least one of shape and dimensions.

The first surface 20, the first surface 30, and the first surface 40 are set to shapes that can be two-dimensionally repeated in an array without gaps. Examples of this shape may include triangles, trapezoids, parallelograms, rectangles, squares, and regular hexagons. In this embodiment, a pair of electric power generation units that are adjacent to each other are arranged so that one side of the periphery of one electric power generation unit substantially coincides with one side of the periphery of the other electric power generation unit. That is, in this embodiment, a plurality of electric power generation units are installed without gaps between electric power generation units.

More specifically, the solar cell module 1 according to this embodiment includes one first electric power generation unit 2, four second electric power generation units 3, and four third electric power generation units 4. In this embodiment, the first electric power generation unit 2 is located at the center of the solar cell module 1.

In this embodiment, each of the second electric power generation units 3 is arranged adjacent to one side of the periphery of the first electric power generation unit 2. The second electric power generation units 3 are arranged adjacent to the first electric power generation unit 2 so that one side of the periphery of each of the second electric power generation units 3 coincides with one side of the periphery of the first electric power generation unit 2. In this embodiment, the third electric power generation units 4 are arranged diagonally across the periphery of the first electric power generation unit 2. The third electric power generation units 4 are arranged so that one side of the periphery of each of the third electric power generation units 4 coincides with one side of the periphery of one of the second electric power generation units 3.

The number of first electric power generation units 2, the number of second electric power generation units 3, and the number of third electric power generation units 4 can be arbitrarily set. One or more electric power generation units among a plurality of electric power generation units may be different from the other electric power generation units in at least one of shape and dimensions. One or more electric power generation units among the first electric power generation unit 2, the second electric power generation units 3, and the third electric power generation units 4 may be shaped into a bar or a block. The first electric power generation unit 2, the second electric power generation units 3, and the third electric power generation units 4 may be regularly or irregularly arranged in any pattern. The periphery of one of a pair of electric power generation units that are adjacent to each other may be spaced from that of the other. Further, the solar cell module 1 may have gaps between the plurality of electric power generation units, and at least some of the gaps may be filled with an adhesive or the like.

In this embodiment, the first electric power generation unit 2, the second electric power generation units 3, and the third electric power generation units 4 are arranged so that the first surface 20, the first surfaces 30, and the first surfaces 40 are oriented in the same direction. In this embodiment, the first surface 20, the first surfaces 30, and the first surfaces 40 are parallel to one another. In this embodiment, the first surface 20, the first surfaces 30, and the first surfaces 40 are substantially flush with one another (which can be arranged on the same plane).

At least one surface among the first surface 20, the first surfaces 30, and the first surfaces 40 may be inclined with respect to the other surfaces. At least one surface among the first surface 20, the first surfaces 30, and the first surfaces 40 may be stepped with respect to the other surfaces.

In this embodiment, the first electric power generation unit 2, the second electric power generation units 3, and the third electric power generation units 4 are fixed to one another using an adhesive or the like. The first electric power generation unit 2, the second electric power generation units 3, and the third electric power generation units 4 may be fixed to the same frame.

The first electric power generation unit 2 illustrated in FIG. 2 and FIG. 3 includes a first-fluorescent-type light guide unit 21 and a solar cell element 22. The first-fluorescent-type light guide unit 21 according to this embodiment has a main body unit 23 having light transmission properties, and a first fluorescent material 24 dispersed in the main body unit 23. The main body unit 23 is formed of, for example, an organic material such as an acrylic resin or a polycarbonate resin and an inorganic material such as a glass.

The materials of which the main body unit 23 is formed are not particularly limited. The first fluorescent material 24 contains a fluorescent substance.

As illustrated in FIG. 8, the emission spectra of fluorescent substances differ from one fluorescent substance to another.

The absorption spectrum and emission spectrum of the first fluorescent material 24 may be set by appropriately selecting a fluorescent substance constituting the first fluorescent material. The first fluorescent material 24 according to this embodiment absorbs ultraviolet radiation in the light L, and emits the first light L1 having a longer wavelength than the ultraviolet radiation. Ultraviolet radiation is light having a wavelength less than 380 nm. In this embodiment, the first light L1 includes visible light.

The first fluorescent material 24 may not necessarily absorb ultraviolet radiation. The first fluorescent material 24 may absorb at least one of visible light and infrared radiation in the light L. Visible light is light having a wavelength in a range from 380 nm or more to 750 nm or less. Infrared radiation is light having a wavelength longer than 750 nm. The first fluorescent material 24 may absorb ultraviolet radiation in the light L, and emit ultraviolet radiation having a wavelength longer than the ultraviolet radiation. The first fluorescent material 24 may contain a plurality of kinds of fluorescent substances. In a case where the first fluorescent material 24 includes a plurality of kinds of fluorescent substances, the first fluorescent material 24 has an emission spectrum that is a spectrum corresponding to the emission spectrum of each fluorescent substance contained in the first fluorescent material 24 or corresponding to the composition ratio of the plurality of kinds of fluorescent substances.

The first-fluorescent-type light guide unit 21 illustrated in FIG. 2 has the first surface 20 oriented toward the outside from the first-fluorescent-type light guide unit 21, a second surface 25 oriented in a direction opposite to the first surface 20, and a third surface 26 adjoining the first surface 20 and the second surface 25. In this embodiment, one of the front and back surfaces of the first-fluorescent-type light guide unit 21 is the first surface 20 and the other surface is the second surface 25. Each of the first surface 20 and the second surface 25 according to this embodiment includes a flat surface. Substantially the entire surface of each of the first surface 20 and the second surface 25 according to this embodiment is flat. The first surface 20 according to this embodiment is parallel to the second surface 25. The periphery of each of the first surface 20 and the second surface 25 according to this embodiment has a substantially polygonal shape. The substantially polygonal shape is the shape of a polygon or a polygon whose corners have been rounded off. The first surface 20 and the second surface 25 according to this embodiment are substantially square. In this embodiment, the periphery of the first surface 20 has the same dimensions as the periphery of the second surface 25.

Note that at least one of the first surface 20 and the second surface 25 may include a curved surface. At least part of the first surface 20 may be non-parallel to at least part of the second surface 25. The periphery of the first surface 20 may be different from that of the second surface 25 in at least one of shape and dimensions. The periphery of at least one of the first surface 20 and the second surface 25 may not necessarily have a substantially polygonal shape. At least one of the first surface 20 and the second surface 25 may have a shape whose periphery includes a curved line, such as a circle, an ellipse, or an oval.

The third surface 26 according to this embodiment is oriented in a direction different from the first surface 20 and the second surface 25. The third surface 26 adjoins the first surface 20 at the periphery of the first surface 20. The third surface 26 adjoins the second surface 25 at the periphery of the second surface 25. The third surface 26 according to this embodiment is shaped into a ring that connects the periphery of the first surface 20 and the periphery of the second surface 25. The area of the third surface 26 according to this embodiment is smaller than the area of the first surface 20.

The third surface 26 according to this embodiment includes a plurality of end surfaces 26a to 26d that are consecutive along the periphery of the first surface 20. In this embodiment, each of the plurality of end surfaces 26a to 26d includes a flat surface. In this embodiment, substantially the entire surface of each of the plurality of end surfaces 26a to 26d is flat. In this embodiment, the plurality of end surfaces 26a to 26d are perpendicular to the first surface 20 and the second surface 25. The end surface 26a according to this embodiment is oriented in a direction opposite to the end surface 26c. The end surface 26a according to this embodiment is parallel to the end surface 26c. The end surface 26b according to this embodiment is oriented in a direction opposite to the end surface 26d. The end surface 26b according to this embodiment is parallel to the end surface 26d. The end surface 26a according to this embodiment is perpendicular to the end surface 26b and the end surface 26d. The end surface 26c according to this embodiment is perpendicular to the end surface 26b and the end surface 26d.

At least one of the plurality of end surfaces 26a to 26d may include a curved surface. At least one of the plurality of end surfaces 26a to 26d may be non-perpendicular to at least one of the first surface 20 and the second surface 25. The end surface 26a may be non-parallel to the end surface 26c. The end surface 26b may be non-parallel to the end surface 26d. The end surface 26a may be perpendicular to at least one of the end surface 26b and the end surface 26d. The end surface 26c may be perpendicular to at least one of the end surface 26b and the end surface 26d.

As illustrated in FIG. 3, at least part of the light L incident on the first surface 20 penetrates the first surface 20, and is absorbed in the first fluorescent material 24 in the first-fluorescent-type light guide unit 21. The first fluorescent material 24 is excited by light energy received from the light L, and emits the first light L1 having a spectrum corresponding to the composition of the first fluorescent material 24. The first light L1 emitted from the first fluorescent material 24 travels in directions around the first fluorescent material 24. The first light L1 emitted from the first fluorescent material 24, almost of which travels toward the third surface 26, also travels toward the first surface 20 or the second surface 25.

Part of the first light L1 traveling from the first fluorescent material 24 toward the second surface 25 is reflected from an inner surface 27 of the second surface 25. In this embodiment, the first light L1 reflected from the inner surface 27 includes at least one of light reflected by the satisfaction of a total reflection condition for the inner surface 27 and light reflected with a reflectivity determined by the angle of incidence on the inner surface 27, without the satisfaction of the total reflection condition for the inner surface 27.

The first light L1 reflected from the inner surface 27 of the second surface 25 has a travel direction that differs from that before reflection, and travels toward the first surface 20 while traveling toward the third surface 26. The first light L1 reflected from an inner surface 28 of the first surface 20 has a travel direction that differs from that before reflection, and travels toward the second surface 25 while traveling toward the third surface 26.

In the manner described above, the first light L1 is guided to the third surface 26 between the first surface 20 and the second surface 25. At least part of the first light L1 that has reached the third surface 26 passes through the third surface 26, and is emitted outside the first-fluorescent-type light guide unit 21.

Note that part of the first light L1 traveling from the first fluorescent material 24 toward the second surface 25 passes through the second surface 25, and is emitted outside the first-fluorescent-type light guide unit 21 from the second surface 25. Further, part of the first light L1 traveling toward the first surface 20 travels through the first surface 20, and is emitted outside the first-fluorescent-type light guide unit 21 from the first surface 20.

The solar cell element 22 is arranged so that at least part of a light receiving surface thereof is oriented toward the third surface 26.

In this embodiment, the area of the light receiving surface of the solar cell element 22 is smaller than the area of the first surface 20. The first light L1 that has passed through the third surface 26 of the first-fluorescent-type light guide unit 21 enters the light receiving surface of the solar cell element 22, and causes the solar cell element 22 to generate electric charge. In this manner, the solar cell element 22 is capable of generating electric power upon receipt of the first light L1. In this embodiment, the solar cell element 22 is provided on each of the four end surfaces 26a to 26d.

The solar cell element 22 is constituted by one or more than one of various kinds of solar cells such as silicon-based solar cells, compound-based solar cells, organic-based solar cells, and dye-sensitized solar cells. Specific examples of the silicon-based solar cells include an α-Si solar cell that uses amorphous silicon, a c-Si solar cell that uses crystalline-based silicon such as polycrystalline silicon or microcrystalline silicon, and a multi-junction (tandem) solar cell that uses amorphous silicon and crystalline-based silicon. Examples of the compound-based solar cells include a solar cell including the single junction of a layer formed of a compound semiconductor material, and a multi-junction solar cell including the multi-junction of two or more layers formed of a compound semiconductor material. Examples of the compound semiconductor material, described above, include InGaP, GaAs, InGaAs, and chalcopyrite materials.

As illustrated in FIG. 9, various kinds of solar cells have different spectral sensitivities. The solar cell element 22 according to this embodiment has a spectral sensitivity in the wavelength band of the first light L1. The solar cell element 22 according to this embodiment is constituted by a solar cell whose spectral sensitivity matches a peak wavelength of the spectrum of the first light L1. As the solar cell element 22 according to this embodiment, a solar cell having a relatively high spectral sensitivity in the wavelength band of the first light L1 among the various kinds of solar cells described above is selected.

For example, the proportion of visible light in the spectrum of the first light L1 may be larger than the proportion of infrared radiation, and the solar cell element 22 may be an α-Si solar cell. The proportion of infrared radiation in the spectrum of the first light L1 may be larger than the proportion of visible light, and the solar cell element 22 may be a c-Si solar cell. The proportion of ultraviolet radiation in the spectrum of the first light L1 may be larger than the proportion of visible light, and the solar cell element 22 may be an InGaP solar cell. The proportion of visible light in the spectrum of the first light L1 may be larger than any of the proportion of ultraviolet radiation and the proportion of infrared radiation, and the solar cell element 22 may be a GaAs solar cell. The proportion of infrared radiation in the spectrum of the first light L1 may be larger than the proportion of visible light, and the solar cell element 22 may be an InGaAs solar cell.

The first light L1 may include ultraviolet radiation, visible light, and infrared radiation, and the solar cell element 22 may be a tandem solar cell.

Furthermore, the first fluorescent material 24 may contain Lumogen F Yellow 083 (trade name, manufactured by BASF Aktiengesellschaft) illustrated in FIG. 8, and the solar cell element 22 may be an α-Si solar cell. The first fluorescent material 24 may contain Lumogen F Yellow 170 (trade name, manufactured by BASF Aktiengesellschaft), and the solar cell element 22 may be an α-Si solar cell. The first fluorescent material 24 may contain Lumogen F Red 305 (trade name, manufactured by BASF Aktiengesellschaft), and the solar cell element 22 may be a c-Si solar cell. The first fluorescent material 24 may contain Lumogen F Violet 570 (trade name, manufactured by BASF Aktiengesellschaft), and the solar cell element 22 may be a dye-sensitized solar cell.

The combinations of light guide units and solar cells described above may also be applied to electric power generation units other than the first electric power generation unit 2 among the plurality of electric power generation units.

The second electric power generation unit 3 illustrated in FIG. 4 includes a second-fluorescent-type light guide unit 31 and a solar cell element 32. Similarly to the first-fluorescent-type light guide unit 21, the second-fluorescent-type light guide unit 31 has the first surface 30 oriented toward the outside from the second-fluorescent-type light guide unit 31, a second surface 35 oriented in a direction opposite to the first surface 30, and a third surface 36 adjoining the first surface 30 and the second surface 35. The third surface 36 according to this embodiment includes a plurality of end surfaces 36a to 36d that are consecutive along the periphery of the first surface 30. The shape and relative relationship of the respective surfaces of the second-fluorescent-type light guide unit 31 can be changed, if necessary, in a manner similar to that described with the first-fluorescent-type light guide unit 21.

As illustrated in FIG. 5, the second-fluorescent-type light guide unit 31 according to this embodiment includes a main body unit 33 having light transmission properties, and a second fluorescent material 34 dispersed in the main body unit 33. The main body unit 33 is similar to the main body unit 23 of the first-fluorescent-type light guide unit 21. The emission spectrum of the second fluorescent material 34 is different from that of the first fluorescent material 24. In this embodiment, the second fluorescent material 34 includes a fluorescent substance different from that of the first fluorescent material 24.

The second fluorescent material 34 may include a plurality of kinds of fluorescent substances. The second fluorescent material 34 may include a plurality of kinds of fluorescent substances, and one or more kinds thereof may be the same as the fluorescent substances included in the first fluorescent material 24.

As illustrated in FIG. 5, at least part of the light L incident on the first surface 30 of the second-fluorescent-type light guide unit 31 penetrates the first surface 30, and is absorbed in the second fluorescent material 34 in the second-fluorescent-type light guide unit 31. The second fluorescent material 34 is excited by light energy received from the light L, and emits the second light L2 having a spectrum corresponding to the composition of the second fluorescent material 34. The second light L2 is light whose spectrum (wavelength) is different from that of the first light L1.

Similarly to the first-fluorescent-type light guide unit 21, the second light L2 emitted from the second fluorescent material 34 is reflected between an inner surface 38 of the first surface 30 and an inner surface 37 of the second surface 35, and is guided to the third surface 36. At least part of the second light L2 that has reached the third surface 36 passes through the third surface 36, and is emitted outside the second-fluorescent-type light guide unit 31.

The solar cell element 32 is arranged so that at least part of a light receiving surface thereof is oriented toward the third surface 36.

In this embodiment, the solar cell element 32 is provided on each of the four end surfaces 36a to 36d. The second light L2 that has passed through the third surface 36 of the second-fluorescent-type light guide unit 31 enters the light receiving surface of the solar cell element 32, and causes the solar cell element 32 to generate electric charge. In this manner, the solar cell element 32 is capable of generating electric power upon receipt of the second light L2.

The solar cell element 32 is constituted by one or more than one of the various kinds of solar cells described above.

The solar cell element 32 according to this embodiment is constituted by a solar cell whose spectral sensitivity matches the spectrum of the second light L2. For example, in a case where the spectral sensitivity of the solar cell element 22 of the first electric power generation unit 2 does not match the spectrum of the second light L2, the solar cell element 32 of the second electric power generation unit 3 is constituted by a solar cell having a spectral sensitivity different from the solar cell element 22.

The combinations of fluorescent materials and solar cells will now be described by way of specific example. It is assumed that the first fluorescent material 24 includes Lumogen F Violet 570 (trade name) manufactured by BASF Aktiengesellschaft and the second fluorescent material 34 includes NILE BLUE A Perchlorate (CAS Registry Number 3625-57-8). In this case, as illustrated in FIG. 8, the emission spectrum of the first fluorescent material 24 has a peak wavelength of 413 nm. The solar cell element 22 is constituted by, for example, an InGaP solar cell so that the spectral sensitivity matches the emission spectrum of the first fluorescent material 24. Further, the emission spectrum of the second fluorescent material 34 has a peak wavelength of 640 nm. In this case, the solar cell element 32 is constituted by a solar cell whose spectral sensitivity matches the spectrum of the second light L2 more than the solar cell element 22, for example, a GaAs solar cell.

In a case where the spectral sensitivity of the solar cell element 22 of the first electric power generation unit 2 matches the spectrum of the second light L2, the solar cell element 32 of the second electric power generation unit 3 may be constituted by the same solar cell as the solar cell element 22.

The third electric power generation unit 4 illustrated in FIG. 6 includes a third-fluorescent-type light guide unit 41 and a solar cell element 42. Similarly to the first-fluorescent-type light guide unit 21, the third-fluorescent-type light guide unit 41 has the first surface 40 oriented toward the outside from the third-fluorescent-type light guide unit 41, a second surface 45 oriented in a direction opposite to the first surface 40, and a third surface 46 adjoining the first surface 40 and the second surface 45. The third surface 46 according to this embodiment includes a plurality of end surfaces 46a to 46d that are consecutive along the periphery of the first surface 40. The shape and relative relationship of the respective surfaces of the third-fluorescent-type light guide unit 41 can be changed, if necessary, in a manner similar to that described with the first-fluorescent-type light guide unit 21.

As illustrated in FIG. 7, the third-fluorescent-type light guide unit 41 according to this embodiment includes a main body unit 43 having light transmission properties, and a third fluorescent material 44 dispersed in the main body unit 43.

The main body unit 43 is similar to the main body unit 23 of the first-fluorescent-type light guide unit 21. The emission spectrum of the third fluorescent material 44 is different from that of any of the first fluorescent material 24 and the second fluorescent material 34. The third fluorescent material 44 according to this embodiment includes a fluorescent substance different from that of the first fluorescent material 24 and the second fluorescent material 34.

The third fluorescent material 44 may include a plurality of kinds of fluorescent substances. The third fluorescent material 44 may include a plurality of kinds of fluorescent substances, and one or more kinds thereof may be the same as the fluorescent substance included in the first fluorescent material 24 or the second fluorescent material 34.

As illustrated in FIG. 7, at least part of the light L incident on the first surface 40 of the third-fluorescent-type light guide unit 41 penetrates the first surface 40, and is absorbed in the third fluorescent material 44 in the third-fluorescent-type light guide unit 41. The third fluorescent material 44 is excited by light energy received from the light L, and emits the third light L3 having a spectrum corresponding to the composition of the third fluorescent material 44. The third light L3 is light having a spectrum different from the first light L1 and the second light L2.

Similarly to the first-fluorescent-type light guide unit 21, the third light L3 emitted from the third fluorescent material 44 is reflected between an inner surface 48 of the first surface 40 and an inner surface 47 of the second surface 45, and is guided to the third surface 46. At least part of the third light L3 that has reached the third surface 46 passes through the third surface 46, and is emitted outside the third-fluorescent-type light guide unit 41.

The solar cell element 42 is arranged so that at least part of a light receiving surface thereof is oriented toward the third surface 46.

In this embodiment, the solar cell element 42 is provided on each of the four end surfaces 46a to 46d. The third light L3 that has passed through the third surface 46 of the third-fluorescent-type light guide unit 41 enters the light receiving surface of the solar cell element 42, and causes the solar cell element 42 to generate electric charge. In this manner, the solar cell element 42 is capable of generating electric power upon receipt of the third light L3.

The solar cell element 42 is constituted by one or more than one of the various kinds of solar cells described above.

The solar cell element 42 according to this embodiment is constituted by a solar cell whose spectral sensitivity matches the spectrum of the third light L3. For example, in a case where the spectral sensitivity of the solar cell element 22 of the first electric power generation unit 2 does not match the spectrum of the third light L3, the solar cell element 42 of the third electric power generation unit 4 is constituted by a solar cell having a spectral sensitivity different from the solar cell element 22. Further, in a case where the spectral sensitivity of the solar cell element 32 of the second electric power generation unit 3 does not match the spectrum of the third light L3, the solar cell element 42 of the third electric power generation unit 4 is constituted by a solar cell having a spectral sensitivity different from the solar cell element 32.

For example, in the specific example of the combinations of solar cells described above, it is assumed that the third fluorescent material 44 includes Lumogen F Blue 650 (trade name) manufactured by BASF Aktiengesellschaft. In this case, as illustrated in FIG. 8, the spectrum of the third light L3 is spread over a wavelength band from approximately 400 nm to approximately 550 nm. In the specific example described above, the emission spectrum of the first fluorescent material 24 has a peak wavelength of 413 nm, and the emission spectrum of the second fluorescent material 34 has a peak wavelength of 640 nm. In the specific example described above, the solar cell element 22 is constituted by an InGaP solar cell, and the solar cell element 32 is constituted by a GaAs solar cell. The solar cell element 42 is constituted by, for example, an InGaP solar cell whose spectral sensitivity matches the spectrum of the third light L3 more than a GaAs solar cell. That is, the solar cell element 42 according to this example is constituted by a solar cell of a different kind from the solar cell element 32 and a solar cell of the same kind as the solar cell element 22.

In the solar cell module 1 having the configuration described above, part of the first light L1 generated in the first electric power generation unit 2 passes through the first surface 20 or the second surface 25 of the first-fluorescent-type light guide unit 21, and is emitted outside the first electric power generation unit 2. That is, the first-fluorescent-type light guide unit 21 is perceived as a color that bears the color of the first light L1. Similarly, the second-fluorescent-type light guide unit 31 is perceived as a color that bears the color of the second light L2. In addition, the third-fluorescent-type light guide unit 41 is perceived as a color that bears the color of the third light L3. In this embodiment, since the first light L1, the second light L2, and the third light L3 have different wavelengths, the solar cell module 1 is perceived as a color patter including a plurality of colors. In other words, the solar cell module 1 according to this embodiment may be configured to be perceived as a desired color pattern.

The solar cell module 1 according to this embodiment may also be configured so that an image or characters are displayed with light emitted from, for example, a plurality of electric power generation units. Additionally, the solar cell module 1 according to this embodiment may also be used in, for example, show windows, signage (marks, labels, and signs), building wall designs, or the like to produce a space. In this manner, the solar cell module 1 according to this embodiment is more likely to be placed in, for example, an eye-catching location, and can be placed in various locations.

The plurality of electric power generation units according to this embodiment are installed without gaps between the electric power generation units. Therefore, the solar cell module 1 provides an increase in the ratio of the light receiving area to the area of installation corresponding to the reduction in gap, resulting in an increase in the amount of electric power generated per area of installation.

In general, a solar cell module that generates electric power upon a solar cell element receiving light guided in a light guide unit provides a longer optical path length in the light guide unit as the area of the light receiving surface of the light guide unit increases. Accordingly, the amount of light leaking out of the light guide unit may increase, and the power generation efficiency of the solar cell module may be reduced. In addition, as the optical path length in the light guide unit increases, the fluorescent light emitted from a fluorescent material is more likely to be absorbed in the fluorescent material while being guided in the light guide unit. Accordingly, the amount of light received by the solar cell element may be reduced and the power generation efficiency of the solar cell module may be reduced.

In the solar cell module 1 according to this embodiment, the entire light receiving surface of the solar cell module 1 is divided into a plurality of light receiving surfaces of electric power generation units, and each electric power generation unit generates electric power. Thus, the optical path length in the light guide unit can be reduced with respect to the entire light receiving area of the solar cell module 1. This can suppress a reduction in power generation efficiency when, for example, the area of the light receiving surface upon which the solar cell module receives light from outside is increased.

In general, a solar cell has a low spectral sensitivity in the ultraviolet wavelength band. The first fluorescent material 24 according to this embodiment absorbs ultraviolet radiation and emits visible light as the first light L1. Accordingly, a solar cell having a spectral sensitivity which matches the spectrum of the first light L1 can be selected as the solar cell element 22, and the power generation efficiency of the solar cell module 1 can be increased. In addition, the proportion of ultraviolet radiation in the light that has passed through the solar cell module 1 can be reduced. For example, in a case where the solar cell module 1 is used in show windows or the like, ultraviolet radiation damage to the object irradiated with the first light L1 that has passed through the solar cell module 1 can be reduced.

The solar cell module 1 includes four or more kinds of electric power generation units, and each type of electric power generation unit generates fluorescent light upon receipt of the light L and generates electric power by the fluorescent light, where the wavelengths of the fluorescent light of the four or more kinds of electric power generation units may differ. The fluorescent material used for a fluorescent-type light guide unit may absorb light incident from outside the light guide unit and emit light other than visible light, such as ultraviolet radiation. This makes the fluorescent-type light guide unit achromatic and transparent.

In addition, the third electric power generation units 4 may not necessarily be provided. For example, the first electric power generation units 2 or the second electric power generation units 3 may be arranged instead of the third electric power generation units 4. Furthermore, other members different from the first electric power generation unit 2 and the second electric power generation units 3 may be arranged instead of the third electric power generation units 4. The other members, described above, may be members that are, for example, achromatic or chromatic with respect to white light. The other members, described above, may or may not have light transmission properties. The other members, described above, may not necessarily generate electric power.

Next, modified examples will be described. Requirements described in the following modified examples may be used in combination, if necessary. While Modified Examples 1 to 4 will be described in the context of the first electric power generation unit 2 by way of example, similar modifications can also be applied to at least one of the second electric power generation unit 3 and the third electric power generation unit 4. Additionally, modifications similar to Modified Examples 1 to 4 may be applied to one or more electric power generation units among a plurality of electric power generation units, and may not necessarily be applied to one or more of the other electric power generation units.

In the following description, components similar to those in the foregoing embodiment are assigned the same numerals, and a redundant description thereof may be omitted.

Modified Example 1

Figure 10:
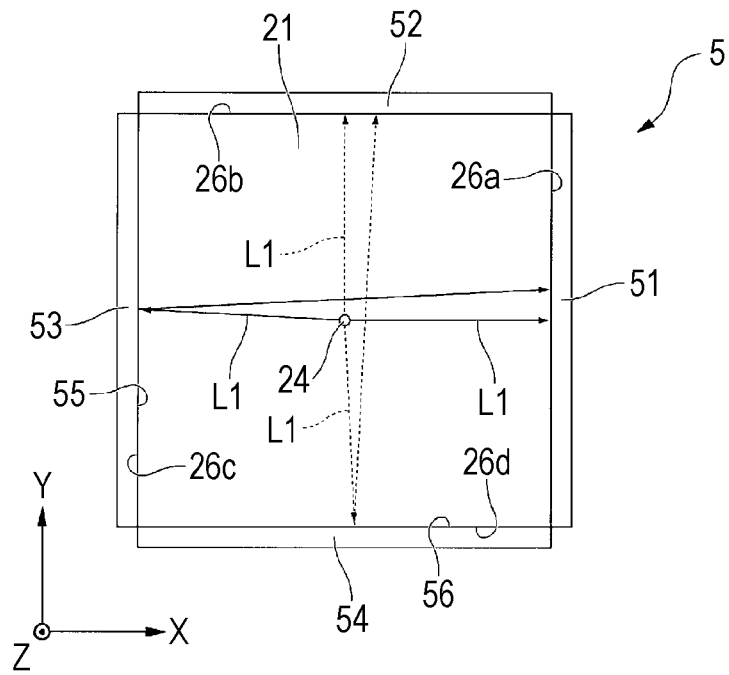
FIG. 10 is a plan view of a first electric power generation unit according to Modified Example 1.

FIG. 10 is a plan view illustrating a first electric power generation unit in a solar cell module according to Modified Example 1. A first electric power generation unit 5 illustrated in FIG. 10 includes a first-fluorescent-type light guide unit 21, a first solar cell element 51, a second solar cell element 52, a first reflection unit 53, and a second reflection unit 54. Each of the first solar cell element 51 and the second solar cell element 52 is similar to the solar cell element 22 of the first electric power generation unit 2 described in the foregoing embodiment. The first solar cell element 51 is arranged so that a light receiving surface thereof is oriented toward an end surface 26a of the light guide unit 21. The second solar cell element 52 is arranged so that a light receiving surface thereof is oriented toward an end surface 26b adjacent to the end surface 26a of the light guide unit 21.

The first reflection unit 53 has a light-reflecting surface 55 having properties from which first light L1 is reflected. The light-reflecting surface 55 according to this example is a specular reflection surface from which incident light is regularly reflected. The first reflection unit 53 is arranged opposite the first solar cell element 51 with respect to the light guide unit 21. The first reflection unit 53 is arranged so that the light-reflecting surface 55 is oriented toward an end surface 26c oriented in a direction opposite to the end surface 26a of the light guide unit 21. The first reflection unit 53 according to this example is fixed to the end surface 26c of the light guide unit 21 using an optical adhesive or the like.

The second reflection unit 54 has a light-reflecting surface 56 having properties from which the first light L1 is reflected. The light-reflecting surface 56 according to this example is a specular reflection surface. The second reflection unit 54 is arranged opposite the second solar cell element 52 with respect to the light guide unit 21. The second reflection unit 54 is arranged so that the light-reflecting surface 56 is oriented toward an end surface 26d oriented in a direction opposite to the end surface 26b of the light guide unit 21. The second reflection unit 54 according to this example is fixed to the end surface 26d of the light guide unit 21 using an optical adhesive or the like.

In the first electric power generation unit 5 according to this example, the first light L1 traveling toward the end surface 26a in the first-fluorescent-type light guide unit 21 is incident on the light receiving surface of the first solar cell element 51. The first light L1 traveling toward the end surface 26b in the light guide unit 21 is incident on the light receiving surface of the second solar cell element 52.

The first light L1 traveling toward the end surface 26c in the light guide unit 21 is reflected from the light-reflecting surface 55 of the first reflection unit 53. Part of the first light L1 reflected from the light-reflecting surface 55 travels toward the end surface 26a, and is incident on the light receiving surface of the first solar cell element 51. Part of the first light L1 reflected from the light-reflecting surface 55 travels toward the end surface 26b, and is incident on the light receiving surface of the second solar cell element 52.

Part of the first light L1 reflected from the light-reflecting surface 55 travels toward the end surface 26d, and is reflected from the light-reflecting surface 56 of the second reflection unit 54. After that, the reflected light travels toward the end surface 26a, and is incident on the light receiving surface of the first solar cell element 51. Similarly to the first light L1 traveling toward the end surface 26c, the first light L1 traveling toward the end surface 26d in the light guide unit 21 is reflected from the light-reflecting surface 56, and is then incident on the light receiving surface of the first solar cell element 51 or the light receiving surface of the second solar cell element 52.

In the first electric power generation unit 5 according to this example, the first light L1 traveling toward any of the end surfaces 26a to 26d is incident on the first solar cell element 51 or the second solar cell element 52. In the first electric power generation unit 5, therefore, the number of solar cell elements can be reduced, and a reduction in the amount of generated electric power can be suppressed.

Furthermore, since the light-reflecting surface 55 is a specular reflection surface, the first light L1 guided with a total reflection condition for the first surface 20 or the second surface 25 satisfied is also expected to satisfy the total reflection condition for the first surface 20 or the second surface 25 even after being reflected from the light-reflecting surface 55. Thus, the first light L1 reflected from the light-reflecting surface 55 is suppressed from becoming light that leaks out from the first surface 20 or the second surface 25. The same applies to the first light L1 incident on the light-reflecting surface 56. In this manner, the first electric power generation unit 5 according to this example can suppress a reduction in power generation efficiency while the number of solar cell elements is reduced.

The first reflection unit 53 may be a reflective film formed on the end surface 26c of the light guide unit 21. The second reflection unit 54 may be a reflective film formed on the end surface 26d of the light guide unit 21. At least one of the light-reflecting surface 55 and the light-reflecting surface 56 may be a light-reflecting and scattering surface from which incident light is reflected and scattered.

Modified Example 2

Figure 11:
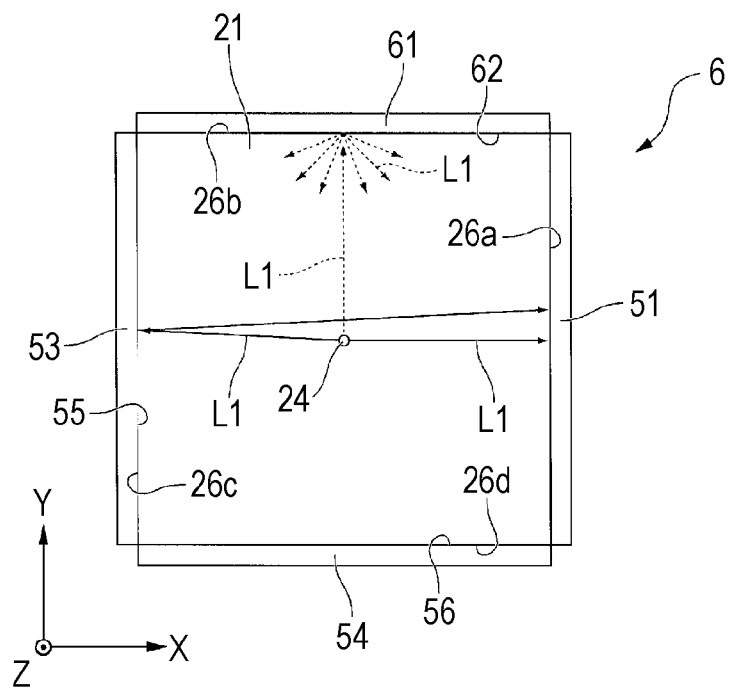
FIG. 11 is a plan view of a first electric power generation unit according to Modified Example 2.

FIG. 11 is a plan view illustrating a first electric power generation unit in a solar cell module according to Modified Example 2. A first electric power generation unit 6 illustrated in FIG. 11 includes a first-fluorescent-type light guide unit 21, a solar cell element 51, a first reflection unit 53, a second reflection unit 54, and a third reflection unit 61. The first electric power generation unit 6 has a configuration in which the third reflection unit 61 is arranged instead of the second solar cell element 52 in Modified Example 1.

The third reflection unit 61 has a light-reflecting surface 62 having properties from which first light L1 is reflected. The light-reflecting surface 62 is a light-reflecting and scattering surface. The third reflection unit 61 is arranged so that the light-reflecting surface 62 is oriented toward the end surface 26b of the first-fluorescent-type light guide unit 21.

In the first electric power generation unit 6 according to this example, the first light L1 traveling toward the end surface 26b in the light guide unit 21 is reflected and scattered from the light-reflecting surface 62. Part of the first light L1 reflected from the light-reflecting surface 62 is incident directly on the solar cell element 51 without being reflected from a reflection unit. Part of the first light L1 reflected from the light-reflecting surface 62 is reflected from at least one of the first reflection unit 53 and the second reflection unit 54, and is incident indirectly on the solar cell element 51. Since the light-reflecting surface 62 is a light-reflecting and scattering surface, the amount of first light reciprocating between the second reflection unit 54 and the third reflection unit 61 can be reduced, and the average optical path length in the light guide unit 21 can be reduced.

At least one of the light-reflecting surface 55 and the light-reflecting surface 56 may be a light-reflecting and scattering surface. All the light-reflecting surface 55, the light-reflecting surface 56, and the light-reflecting surface 62 may be specular reflection surfaces.

Modified Example 3

Figure 12:
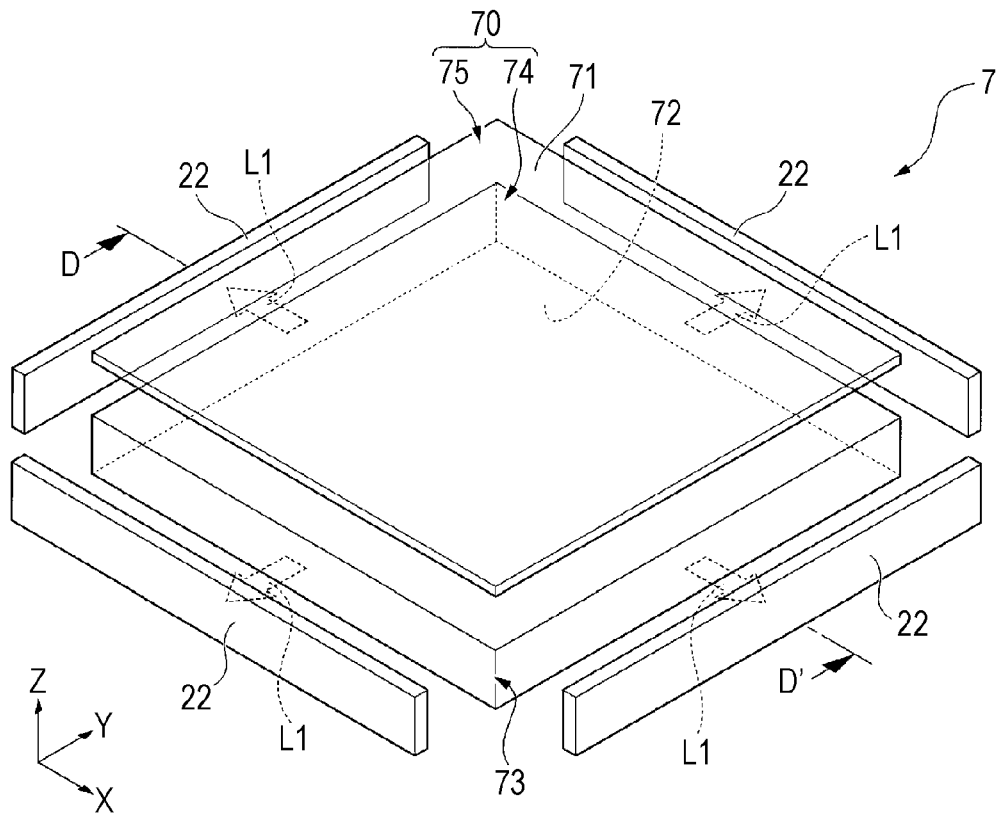
FIG. 12 is an exploded perspective view of a first electric power generation unit according to Modified Example 3.
Figure 13:
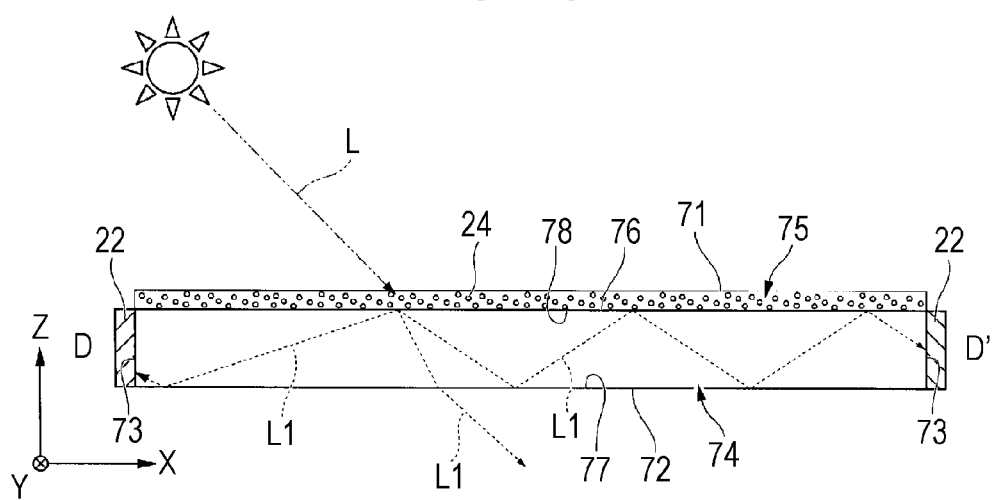
FIG. 13 is a cross-sectional schematic view of the first electric power generation unit according to Modified Example 3.

FIG. 12 is an exploded perspective view illustrating a first electric power generation unit in a solar cell module according to Modified Example 3. FIG. 13 is a cross-sectional schematic view taken along the line D-D' in FIG. 12. A first electric power generation unit 7 illustrated in FIG. 12 and FIG. 13 includes a first-fluorescent-type light guide unit 70 and a solar cell element 22.

The first electric power generation unit 7 according to this example has a configuration in which the first-fluorescent-type light guide unit 70 is employed instead of the first-fluorescent-type light guide unit 21. The shape and positional relationship of the respective surfaces of the first electric power generation unit 7 can be changed, if necessary, in a manner similar to that in the first-fluorescent-type light guide unit 21.

The first-fluorescent-type light guide unit 70 according to this example has a first surface 71, a second surface 72 oriented in a direction opposite to the first surface 71, and a third surface 73 adjoining the first surface 71 and the second surface 72. The first-fluorescent-type light guide unit 70 has a main body unit 74 having light transmission properties, and a fluorescent layer 75 containing a first fluorescent material 24.

The main body unit 74 according to this example is shaped into a rectangular plate. The main body unit 74 according to this example is formed of at least one of an organic material such as an acrylic resin or a polycarbonate resin and an inorganic material such as a glass. The concentration (% by weight) of the fluorescent substance contained in the main body unit 74 according to this example is lower than the concentration (% by weight) of the fluorescent substance contained in the fluorescent layer 75. The main body unit 74 according to this example does not substantially include a fluorescent substance. The main body unit 74 according to this example is made of a transparent material that is achromatic with respect to white light.

Note that the main body unit 74 may include a fluorescent substance. The fluorescent substance may be a fluorescent substance that does not absorb the first light L1. The main body unit 74 may be made of a material that is chromatic with respect to white light. The main body unit 74 may be made of a material that does not substantially absorb the first light L1.

The fluorescent layer 75 according to this example is disposed on one side 76 of the front and back surfaces of the main body unit 74. That is, in this example, the surface of the fluorescent layer 75 oriented in a direction opposite the main body unit 74 is the first surface 71. In this example, the surface of the main body unit 74 opposite the one side 76 is the second surface 72. In this example, an annular surface connecting the one side 76 and the second surface 72 is the third surface 73. The fluorescent layer 75 according to this example is a fluorescent film having the first fluorescent material 24 dispersed therein. The fluorescent layer 75 according to this example adheres to the one side 76 of the main body unit 74. The fluorescent layer 75 is formed by extending, for example, an acrylic resin having the first fluorescent material 24 dispersed therein into a thin film having a thickness of approximately 0.1 mm.

In the first electric power generation unit 7 according to this example, at least part of the light L incident on the first surface 71 is absorbed in the first fluorescent material 24 in the fluorescent layer 75. The first fluorescent material 24 is excited by light energy received from the light L, and emits the first light L1. Part of the first light L1 traveling from the first fluorescent material 24 toward the one side 76 of the main body unit 74 passes through the one side 76. The first light L1 that has passed through the one side 76 travels toward the second surface 72 in the main body unit 74, and also travels toward the third surface 73. At least part of the first light L1 traveling toward the second surface 72 in the main body unit 74 is reflected from an inner surface 77 of the second surface 72, and travels toward the one side 76 in the main body unit 74. At least part of the first light L1 traveling toward the one side 76 in the main body unit 74 is reflected from an inner surface 78 of the one side 76.

In the manner described above, at least part of the first light L1 is guided to the third surface 73 between the first surface 71 and the second surface 72. At least part of the first light L1, which has reached the third surface 73, passes through the third surface 73, and is emitted outside the first-fluorescent-type light guide unit 70. The solar cell element 22 receives the first light L1 that has passed through the third surface 73, and generates electric power.

In the first electric power generation unit 7 according to this example, the first light L1 is not absorbed in the fluorescent substance while propagating in the main body unit 74. Therefore, the reduction in the amount of light received by the solar cell element 22 due to the first light L1 being absorbed in the fluorescent substance can be suppressed, and a reduction in power generation efficiency can be suppressed.

In addition, the first electric power generation unit 7 can be easily recycled by replacing the fluorescent layer 75 when the fluorescent layer 75 is damaged. Furthermore, the first electric power generation unit 7 can easily change the color of light to be emitted outside, by replacing the fluorescent layer 75 with a fluorescent layer including a fluorescent material having a different emission spectrum from the first fluorescent material 24.

Note that modifications similar to the first electric power generation unit 7 can also be applied to at least one of the second electric power generation unit 3 and the third electric power generation unit 4. Additionally, modifications similar to the first electric power generation unit 7 may be applied to one or more electric power generation units among a plurality of electric power generation units, and may not necessarily be applied to one or more of the other electric power generation units.

Modified Example 4

Figure 14:
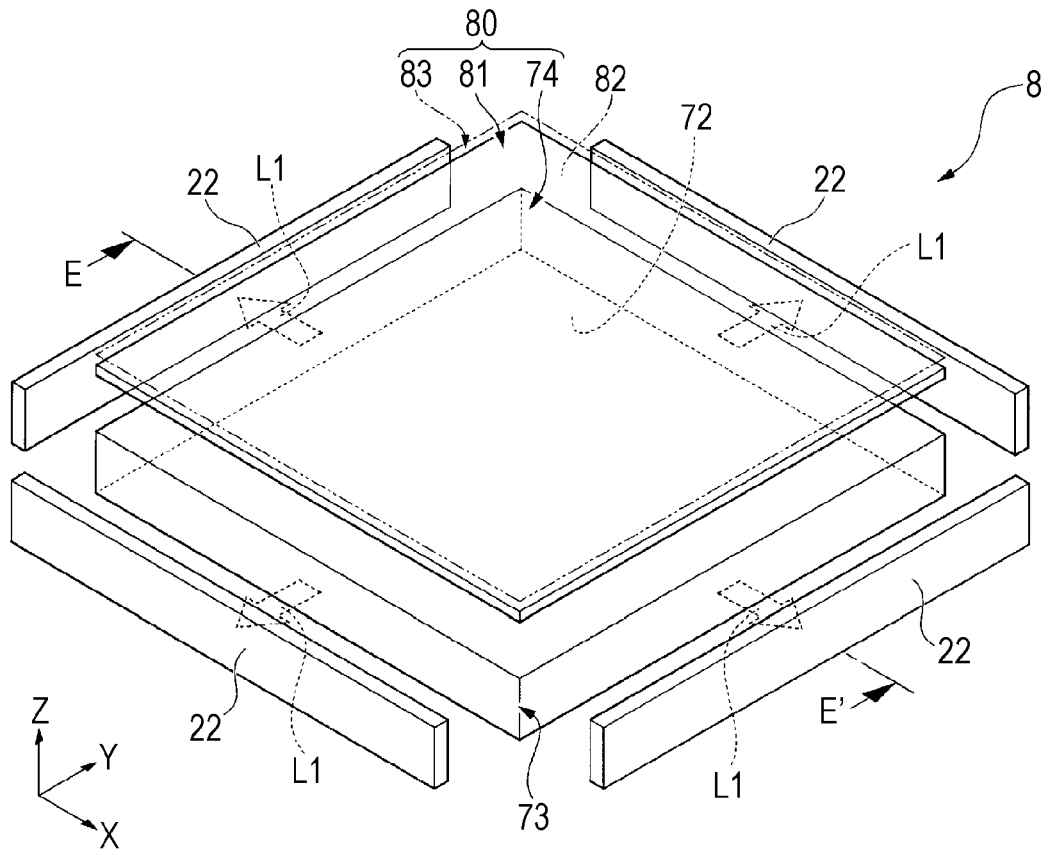
FIG. 14 is an exploded perspective view of a first electric power generation unit according to Modified Example 4.
Figure 15:
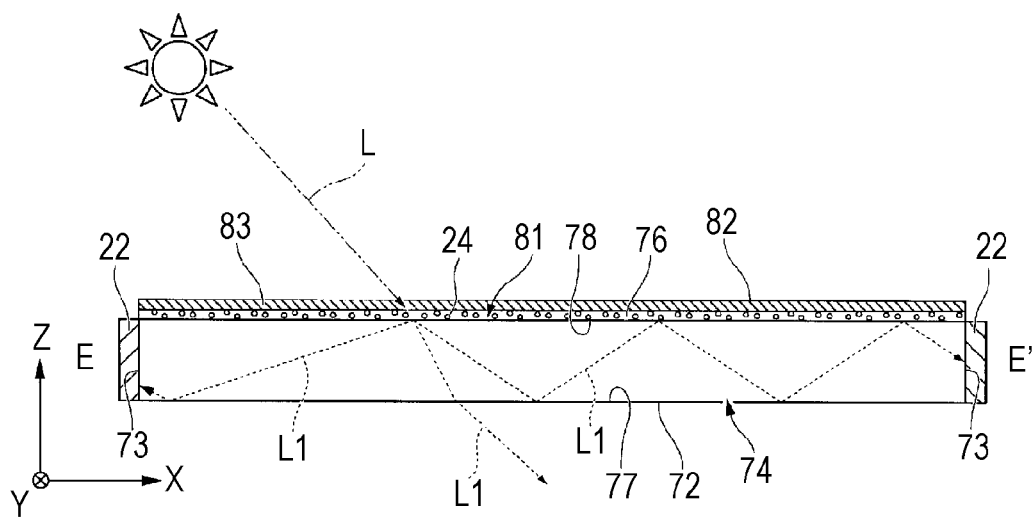
FIG. 15 is a cross-sectional schematic view of the first electric power generation unit according to Modified Example 4.

FIG. 14 is an exploded perspective view illustrating a first electric power generation unit in a solar cell module according to Modified Example 4. FIG. 15 is a cross-sectional schematic view taken along the line E-E' in FIG. 14. A first electric power generation unit 8 illustrated in FIG. 14 and FIG. 15 includes a first-fluorescent-type light guide unit 80 and a solar cell element 22.

The first electric power generation unit 8 according to this example has a configuration in which the first-fluorescent-type light guide unit 80 is employed instead of the first-fluorescent-type light guide unit 21. The shape and positional relationship of the respective surfaces of the first electric power generation unit 8 can be changed, if necessary, in a manner similar to that in the first-fluorescent-type light guide unit 21.

The first-fluorescent-type light guide unit 80 according to this example has a main body unit 74 similar to that in Modified Example 3, and a fluorescent layer 81 containing the first fluorescent material 24. The fluorescent layer 81 is disposed on one side 76 of the main body unit 74. The fluorescent layer 81 according to this example is formed of an adhesive having the first fluorescent material 24 dispersed therein. The first-fluorescent-type light guide unit 80 has a first surface 82, and a second surface 72 oriented in a direction opposite to the first surface 82.

The solar cell module according to this example includes a protective layer 83. The protective layer 83 is arranged opposite the main body unit 74 with respect to the fluorescent layer 81. The protective layer 83 adheres to the one side 76 of the main body unit 74 by the fluorescent layer 81. The protective layer 83 according to this example is provided independently for each of the electric power generation units. That is, the protective layer 83 according to this example is part of the first electric power generation unit 8. In this example, the first surface 82 of the first electric power generation unit 8 is the surface of the protective layer 83 oriented in a direction opposite to the fluorescent layer 81.

The protective layer 83 according to this example is, for example, a hard coat with hardness higher than the main body unit 74 and the fluorescent layer 81. The protective layer 83 according to this example protects the main body unit 74 and the fluorescent layer 81 so as not to cause abrasion or scratching of the main body unit 74 and the fluorescent layer 81.

Note that the fluorescent layer 81 may be the fluorescent film described in Modified Example 3. The protective layer 83 may be provided with an air gap (gas layer) interposed between the protective layer 83 and the fluorescent layer 81. One or more functional films may be disposed between the protective layer 83 and the fluorescent layer 81. The functional film or films, described above, may include an adhesive layer by which the protective layer 83 and the fluorescent layer 81 adhere to each other. The functional film or films, described above, may include a gas barrier layer that suppresses the penetration of degrading gases that degrade at least one of the fluorescent layer 81 and the main body unit 74. The degrading gases, described above, may include at least one of an oxygen gas and a water vapor. The functional film or films, described above, may include an impact damping layer that dampens at least part of an external impact on the protective layer 83. The solar cell module may include the functional film or films, described above, instead of the protective layer 83.

Further, the protective layer 83 may be disposed so as to be continuous over a plurality of electric power generation units.

In this case, the protective layer 83 may be a component separate from the first electric power generation unit 8. In a case where the protective layer 83 is a component separate from the first electric power generation unit 8, the first surface 82 of the first electric power generation unit 8 may be a surface of the fluorescent layer 81 oriented in a direction opposite to the main body unit 74.

Modified Example 5

Figure 16:
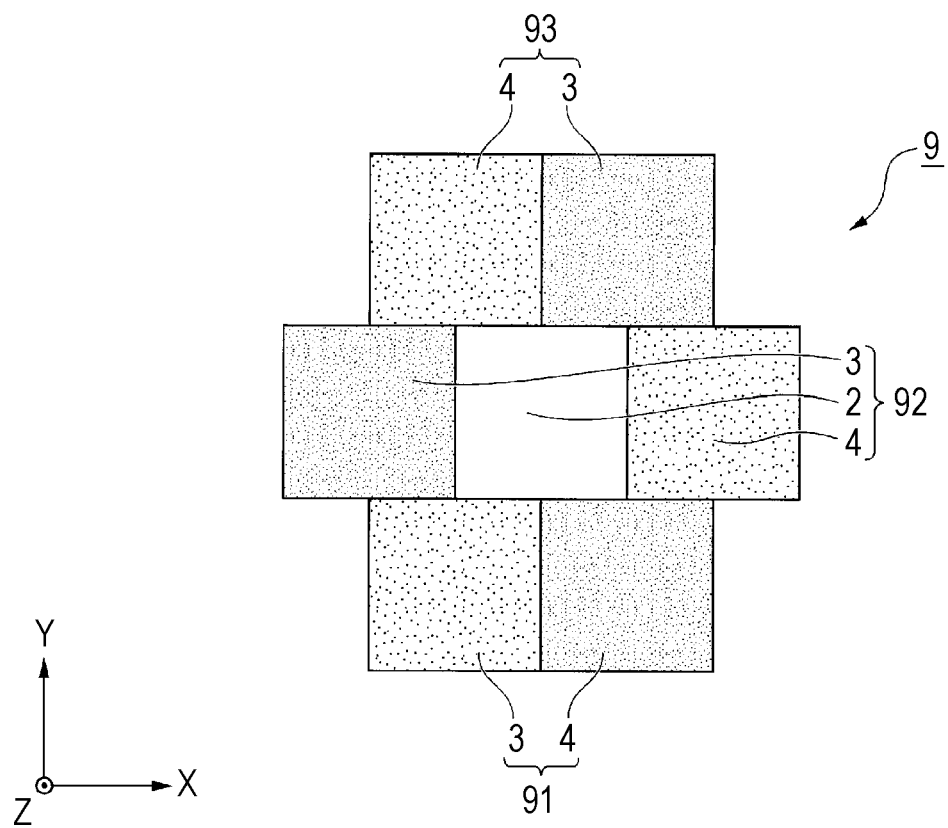
FIG. 16 is a plan view illustrating a solar cell module according to Modified Example 5.

FIG. 16 is a plan view illustrating a solar cell module according to Modified Example 5. A solar cell module 9 illustrated in FIG. 16 includes a plurality of electric power generation units including a first electric power generation unit 2, second electric power generation units 3, and third electric power generation units 4.

The solar cell module 9 according to Modified Example 5 includes a first electric power generation unit row 91, a second electric power generation unit row 92, and a third electric power generation unit row 93 (hereinafter collectively referred to as the plurality of electric power generation unit rows). Each of the plurality of electric power generation unit rows is constituted by two or more electric power generation units linearly arranged in a first direction (X direction) parallel to the first surfaces of the plurality of electric power generation units. The plurality of electric power generation unit rows are arranged in a second direction (Y direction) perpendicular to the first direction. The plurality of electric power generation units are installed without gaps.

In this example, the first direction is a direction parallel to one side of the electric power generation units. When the focus is on the positions of the electric power generation units in the first direction, the electric power generation units belonging to the first electric power generation unit row are arranged between the electric power generation units belonging to the second electric power generation unit row. In this example, a pair of electric power generation units that are adjacent to each other in the second direction are located at positions that are shifted by a certain value in the first direction. In this example, the certain value is set to be substantially half the dimension of each electric power generation unit in the first direction. The certain value is selected in a range from more than zero times to less than one time the dimension of each electric power generation unit in the first direction.

The plurality of electric power generation units according to this example are installed without gaps between the electric power generation units. Therefore, the solar cell module 9 provides an increase in the ratio of the light receiving area to the area of installation corresponding to the reduction in gap, resulting in an increase in the amount of electric power generated per area of installation.

Second Embodiment

Next, a second embodiment will be described. In the following description, components similar to those in the foregoing embodiment are assigned the same numerals, and a redundant description thereof may be omitted.

Figure 17:
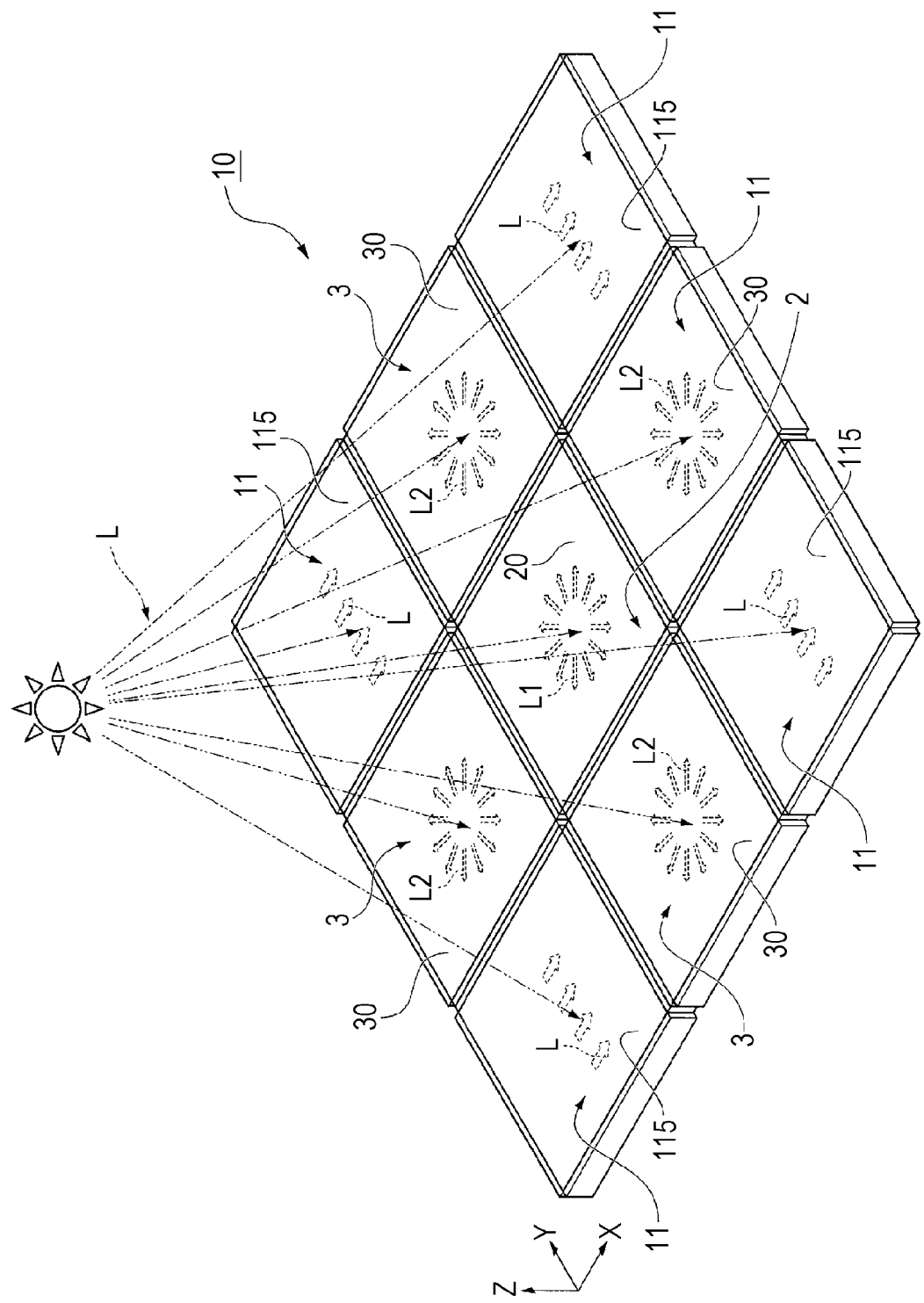
FIG. 17 is a perspective view of a solar cell module according to a second embodiment.
Figure 18:
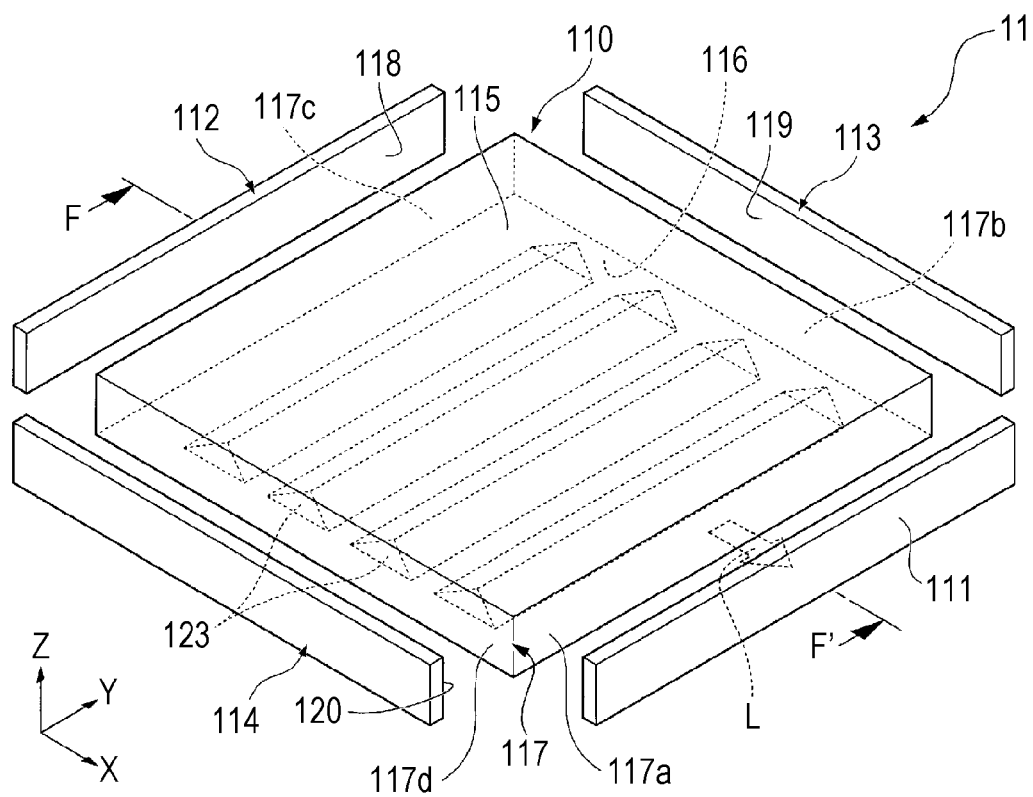
FIG. 18 is an exploded perspective view of a fourth electric power generation unit according to the second embodiment.
Figure 19:
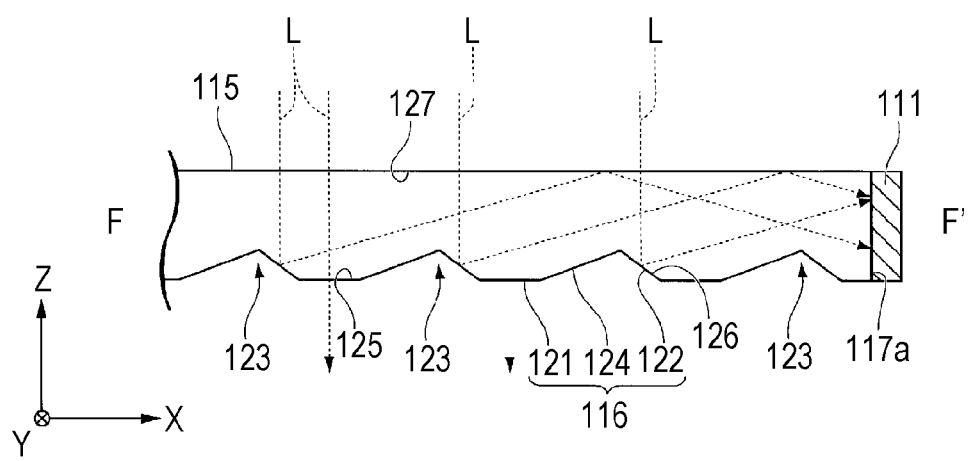
FIG. 19 is a cross-sectional schematic view of the fourth electric power generation unit according to the second embodiment.

FIG. 17 is a perspective view of a solar cell module according to the second embodiment. FIG. 18 is an exploded perspective view of a fourth electric power generation unit. FIG. 19 is a cross-sectional schematic view taken along the line F-F' in FIG. 18. A solar cell module 10 according to this embodiment has a configuration in which fourth electric power generation units 11 are employed instead of the third electric power generation units 4 of the solar cell modules 1 described in the first embodiment.

The fourth electric power generation unit 11 illustrated in FIG. 18 and FIG. 19 includes a shape-dependent light-collection-type light guide unit 110, a solar cell element 111, a first reflection unit 112, a second reflection unit 113, and a third reflection unit 114. The shape-dependent light-collection-type light guide unit 110 has a first surface 115 oriented toward the outside from the shape-dependent light-collection-type light guide unit 110, a second surface 116 oriented in a direction opposite to the first surface 115, and a third surface 117 adjoining the first surface 115 and the second surface 116.

The shape-dependent light-collection-type light guide unit 110 according to this embodiment is shaped into a rectangular plate. The shape-dependent light-collection-type light guide unit 110 according to this embodiment is formed of at least one of an organic material such as an acrylic resin or a polycarbonate resin and an inorganic material such as a glass. The concentration (% by weight) of a fluorescent substance contained in the shape-dependent light-collection-type light guide unit 110 according to this embodiment is lower than the concentration (% by weight) of the fluorescent substance contained in the first-fluorescent-type light guide unit 21 of the first electric power generation unit 2. The shape-dependent light-collection-type light guide unit 110 according to this embodiment does not substantially include a fluorescent substance. The shape-dependent light-collection-type light guide unit 110 according to this embodiment is made of a transparent material that is achromatic with respect to white light.

In this embodiment, one side of the front and back surfaces of the shape-dependent light-collection-type light guide unit 110 is the first surface 115, and the other side is the second surface 116. The third surface 117 according to this embodiment is similar to the third surface of the first-fluorescent-type light guide unit 21 described in the first embodiment. The third surface 117 according to this embodiment includes a plurality of end surface 117a to 117d that are continuous along the periphery of the first surface 115. The shape of the periphery of the first surface 115 and the second surface 116 can be changed in a manner similar to that of the first-fluorescent-type light guide unit 21 described in the first embodiment.

The solar cell element 111 according to this embodiment is arranged so that a light receiving surface thereof is oriented toward an end surface 117a.

The first reflection unit 112 has a light-reflecting surface 118 having properties from which light L is reflected. The first reflection unit 112 is arranged so that the light-reflecting surface 118 is oriented toward an end surface 117c oriented in a direction opposite to the end surface 117a.

The second reflection unit 113 has a light-reflecting surface 119 having properties from which the light L is reflected. The second reflection unit 113 is arranged so that the light-reflecting surface 119 is oriented toward an end surface 117b adjacent to the end surface 117a. The third reflection unit 114 has a light-reflecting surface 120 having properties from which the light L is reflected. The third reflection unit 114 is arranged so that a light-reflecting surface 120 thereof is oriented toward an end surface 117d oriented in a direction opposite to the end surface 117b.

In this embodiment, the light-reflecting surface 118, the light-reflecting surface 119, and the light-reflecting surface 120 are specular reflection surfaces. One or more surfaces among the light-reflecting surface 118, the light-reflecting surface 119, and the light-reflecting surface 120 may be a light-reflecting and scattering surface or surfaces. In addition, one or more surfaces among the light-reflecting surface 118, the light-reflecting surface 119, and the light-reflecting surface 120 may be changed to a surface or surfaces having properties in which the light L is absorbed or through which the light L is transmitted.

In this embodiment, at least part of the first surface 115 of the first-fluorescent-type light guide unit 110 is a flat surface. Substantially the entire of the first surface 115 according to this embodiment is flat. The second surface 116 according to this embodiment includes flat surfaces 121 substantially parallel to the flat surface included in the first surface 115, and first sloping surfaces 122a inclined with respect to the flat surface included in the first surface 115.

More specifically, the shape-dependent light-collection-type light guide unit 110 according to this embodiment has a plurality of grooved portions 123 that are arranged on the second surface 116 side. The flat surfaces 121 according to this embodiment are surfaces arranged outside the periphery of the plurality of grooved portions 123 in the second surface 116. In this embodiment, the plurality of grooved portions 123 extend in a third direction parallel to the first surface 115. In this embodiment, the third direction is a direction parallel to one side of the periphery of the first surface 115.

As illustrated in FIG. 19, in this embodiment, the shape of a cross section of each of the grooved portions 123 parallel to the third direction and perpendicular to the first surface 115 is a triangle. In this embodiment, a sloping surface including one side of the triangle is a first sloping surface 122, and a sloping surface including another side is a second sloping surface 124.

In this embodiment, the first sloping surfaces 122 and the second sloping surfaces 124 are continuous to the flat surfaces 121. In this embodiment, the line of intersection of the first sloping surfaces 122 and the flat surfaces 121 is parallel to the third direction. In this embodiment, the angle defined between the first sloping surfaces 122 and the direction normal to the first surface 115 is larger than the angle defined between the second sloping surfaces 124 and the direction normal to the first surface 115. In this embodiment, the end surface 117a of the third surface 117 is arranged on the side positioned in a direction from the second sloping surfaces 124 to the first sloping surfaces 122 of the grooved portions 123 in a fourth direction perpendicular to the third direction.

In this embodiment, light L incident on the first surface 115 of the shape-dependent light-collection-type light guide unit 110 travels toward the second surface 116 in the light guide unit 110. Part of the light L traveling toward the second surface 116 is incident on an inner surface 125 of one of the flat surfaces 121. The light L incident on the inner surface 125 passes through the inner surface 125, and is emitted outside the light guide unit 110. Part of the light L traveling toward the second surface 116 is incident on an inner surface 126 of one of the first sloping surfaces 122. At least part of the light L incident on the inner surface 126 is reflected from the inner surface 126. In this embodiment, the light reflected from the inner surface 126 includes at least one of light satisfying a total reflection condition for the inner surface 126 and light reflected with a reflectivity corresponding to the angle of incidence on the inner surface 126, without the satisfaction of the total reflection condition for the inner surface 126.

The light L reflected from the inner surface 126 travels toward the end surface 117a, and also travels toward the first surface 115. Part of the light L traveling toward the first surface 115 is incident on an inner surface 127 of the first surface 115, and is reflected from the inner surface 127. In this manner, the light incident on the first sloping surfaces 122 is guided to the end surface 117a of the third surface 117 while being repeatedly reflected between the first surface 115 and the second surface 116. The light L that has reached the end surface 117a passes through the end surface 117a, and is incident on the solar cell element 111. Note that at least part of the light L that has reached the end surface 117b, the end surface 117c, or the end surface 117d of the third surface 117 is reflected from the inner surface of the corresponding end surface, and travels toward the end surface 117a.

The solar cell element 111 according to this embodiment generates electric power upon receipt of the light L that has passed through the end surface 117a. The light L according to this embodiment is sunlight. As illustrated in FIG. 8, sunlight includes ultraviolet radiation, visible light, and infrared radiation. The solar cell element 111 according to this embodiment is constituted by a multi-junction solar cell having a spectral sensitivity for any of ultraviolet radiation, visible light, and infrared radiation. The multi-junction solar cell may be a multi-junction solar cell that uses amorphous silicon and crystalline silicon. The multi-junction solar cell may be a multi-junction solar cell that uses InGaP, GaAs, and InGaAs as compound semiconductors.

As described above, in the fourth electric power generation unit 11, the shape of the second surface 116 is designed such that part of the light L incident from the first surface 115 is reflected from the second surface 116, and travels in a direction non-parallel to that before reflection. That is, the fourth electric power generation unit 11 can generate electric power by light L incident from the first surface 115, even without changing the wavelength of the light L. The fourth electric power generation unit 11 is configured such that the wavelength of the light L does not change in the shape-dependent light-collection-type light guide unit 110, thereby making the shape-dependent light-collection-type light guide unit 110 achromatic and transparent. In this manner, the solar cell module 10 according to this embodiment can have a mixture of chromatic and achromatic portions, and can be placed in various locations.

Note that the shape-dependent light-collection-type light guide unit 110 may include a fluorescent substance. Further, the second electric power generation units 4 may not necessarily be disposed. For example, the first electric power generation units 2 or the fourth electric power generation units 11 may be arranged instead of the second electric power generation units 4. Furthermore, other members different from the first electric power generation unit 2 and the fourth electric power generation units 11 may be arranged instead of the third electric power generation units 4. Moreover, the solar cell module 10 may include, besides the fourth electric power generation units 11, three or more kinds of electric power generation units including the first electric power generation unit 2. The three or more kinds of electric power generation units, described above, generate fluorescent light upon receipt of the light L, and generate electric power by the fluorescent light, where the wavelengths of the fluorescent light may differ.

The shape-dependent light-collection-type light guide unit 110 has protruding portions projecting outward from the flat surfaces 121, and the surfaces of the protruding portions may be sloping surfaces inclined with respect to the flat surfaces 121. The shape-dependent light-collection-type light guide unit 110 may have the protruding portions described above and the grooved portions 123. The second surface 116 side of the shape-dependent light-collection-type light guide unit 110 may be flattened with a material having a different refractive index from the shape-dependent light-collection-type light guide unit 110.

Modified Example 6

Figure 20:
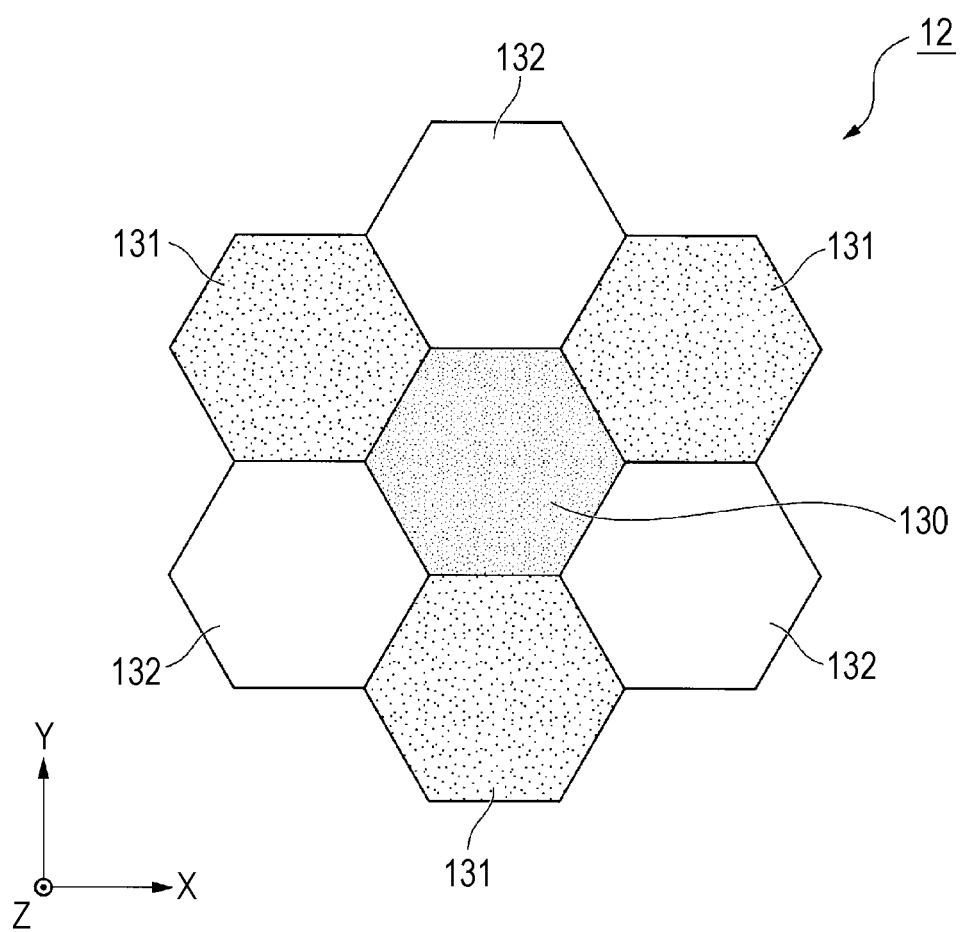
FIG. 20 is a plan view of a solar cell module according to Modified Example 6.

FIG. 20 is a plan view illustrating a solar cell module according to Modified Example 6. A solar cell module 12 illustrated in FIG. 20 includes a plurality of electric power generation units including a first electric power generation unit 130, second electric power generation units 131, and fourth electric power generation units 132. The plurality of electric power generation units according to this example have plate shapes. The plurality of electric power generation units according to this example have regular hexagonal shapes in plan view. The first electric power generation unit 130 according to this example has a structure similar to that of the first electric power generation unit 2 according to the first embodiment, except the shape thereof. The electric power generation units 131 according to this example second have a structure similar to that of the second electric power generation units 3 according to the first embodiment, except the shape thereof. The fourth electric power generation units 132 according to this example have a structure similar to that of the fourth electric power generation units 11 according to the second embodiment, except the shape thereof.

In this example, the plurality of electric power generation units are two-dimensionally installed. In this example, the plurality of electric power generation units are arranged without gaps so that, when viewed in plan, one side of the regular hexagon of each of the plurality of electric power generation units substantially coincides with one side of an adjacent electric power generation unit. Since the plurality of electric power generation units are arranged without gaps, the solar cell module 12 according to this example provides an increase in the ratio of the light receiving area to the area of installation corresponding to the reduction in gap, resulting in an increase in the amount of electric power generated per area of installation.

Note that in Modified Example 6, the second electric power generation units 131 may not necessarily be provided.

In addition, at least either the first electric power generation units 130 or the fourth electric power generation units 132 may be arranged instead of the second electric power generation units 131. Components different from the first electric power generation unit 130 and the fourth electric power generation units 132 may be arranged instead of the second electric power generation units 132.

In Modified Example 6, the fourth electric power generation units 132 may not necessarily be provided. In addition, at least either the first electric power generation units 130 or the second electric power generation units 131 may be arranged instead of the fourth electric power generation units 132. Furthermore, components different from the first electric power generation unit 130 and the second electric power generation units 131 may be arranged instead of the fourth electric power generation units 132. These components may be components formed by changing the plan-view shape of the third electric power generation units described in the first embodiment into a regular hexagon.

Modified Example 7

Figure 21:
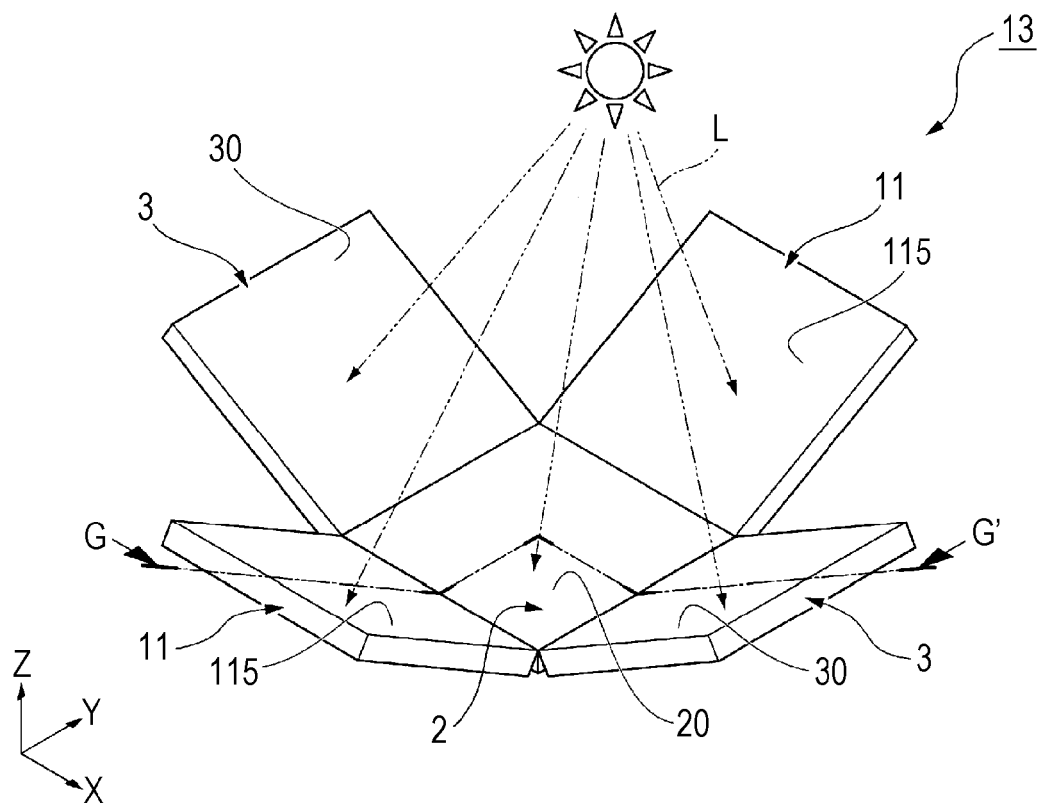
FIG. 21 is a perspective view of a solar cell module according to Modified Example 7.
Figure 22:
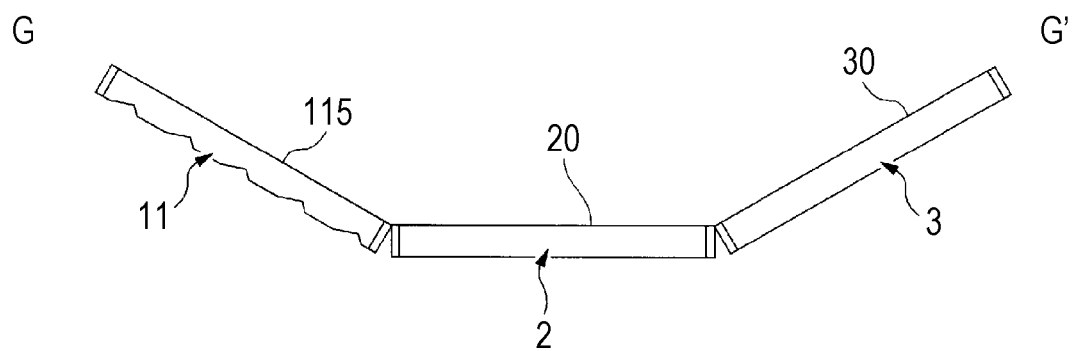
FIG. 22 is a cross-sectional schematic view of the solar cell module according to Modified Example 7.

FIG. 21 is a perspective view illustrating a solar cell module according to Modified Example 7. FIG. 22 is a cross-sectional view taken along the line F-F' in FIG. 21. A solar cell module 13 illustrated in FIG. 21 and FIG. 22 includes a plurality of electric power generation units including a first electric power generation unit 2, second electric power generation units 3, and fourth electric power generation units 11. In this example, the plurality of electric power generation units are three-dimensionally assembled.

In this example, the first electric power generation unit 2 is located at the center of the solar cell module 13. In this example, the second electric power generation units 3 are arranged adjacent to the first electric power generation unit 2 so that one side of the periphery of each of first surfaces 30 thereof substantially coincides with one side of the periphery of a first surface 20 of the first electric power generation unit 2. In this example, the second electric power generation units 3 are arranged so that the first surfaces 30 become non-parallel to the first surface 20 of the first electric power generation unit 2. In this example, part of the second electric power generation units 3 projects from the first electric power generation unit 2 in the direction normal to the first surface 20 of the first electric power generation unit 2.

In this example, the fourth electric power generation units 11 are arranged adjacent to the first electric power generation unit 2 so that one side of the periphery of each of first surfaces 115 thereof substantially coincides with one side of the periphery of the first surface 20 of the first electric power generation unit 2. In this example, the fourth electric power generation units 11 are arranged so that the first surfaces 115 become non-parallel to the first surface 20 of the first electric power generation unit 2. In this example, part of the fourth electric power generation units 11 projects from the first electric power generation unit 2 in the direction normal to the first surface 20 of the first electric power generation unit 2.

[Solar Power Generation Apparatus]

Figure 23:
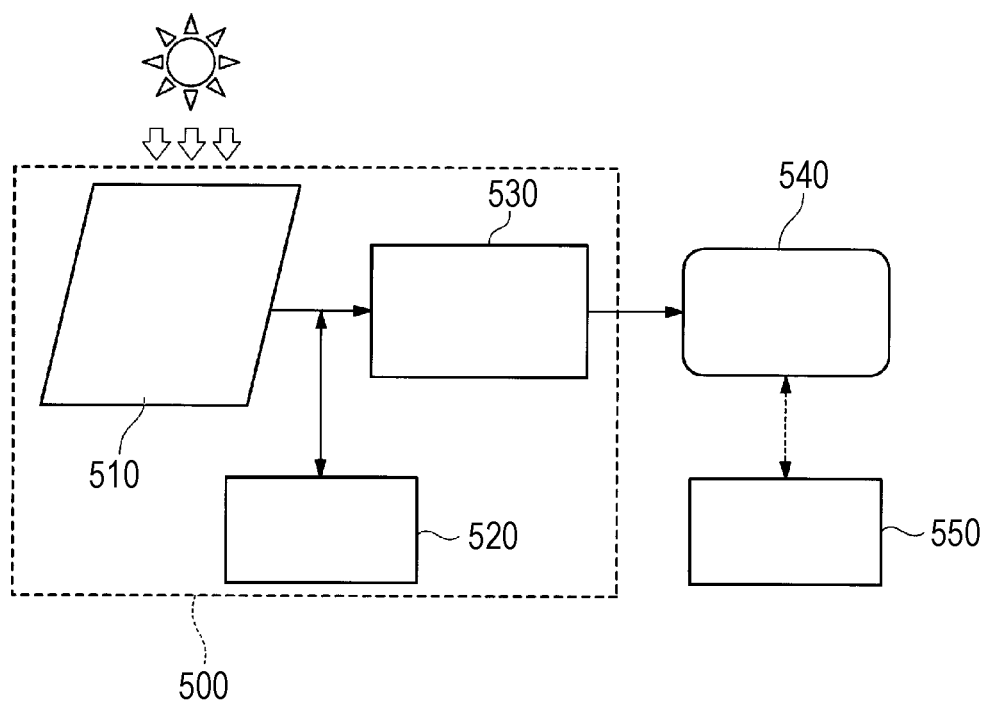
FIG. 23 is a block diagram illustrating a solar cell module according to this embodiment.

Next, an embodiment of a solar power generation apparatus will be described. FIG. 23 is a schematic block diagram of a solar power generation apparatus according to this embodiment.

A solar power generation apparatus 500 includes a solar cell module 510, a storage battery 520, and an inverter 530. The solar cell module 510 is a solar cell module described in the foregoing embodiments. The solar cell module 510 is capable of generating electric power upon receipt of sunlight. The storage battery 520 can be charged by DC power output from the solar cell module 510. The storage battery 520 is capable of discharging the charged DC power to the inverter 530. The inverter 530 is capable of converting the DC power output from at least one of the solar cell module 510 and the storage battery 520 into AC power.

The solar power generation apparatus 500 supplies power to an external electronic device 540. The electronic device 540 is supplied with power from an auxiliary power source 550, if necessary. The solar power generation apparatus 500 includes the solar cell module 510 described in the foregoing embodiments, and can therefore be placed in various locations.

INDUSTRIAL APPLICABILITY

Aspects of the present invention can be applied to a solar cell module and a solar power generation apparatus.

REFERENCE SIGNS LIST 1, 9, 10, 12, 13, 510: solar cell module, 2 to 8, 11, 131 to 133: electric power generation unit, 20, 30, 40, 71, 82, 115: first surface, 25, 35, 45, 72, 116: second surface, 21, 70, 80: first-fluorescent-type light guide unit, 24: first fluorescent material, 31: second-fluorescent-type light guide unit, 34: second fluorescent material, 110: shape-dependent light-collection-type light guide unit, 22, 32, 42, 51, 52, 111: solar cell element, 74: main body unit, 75, 81: fluorescent layer, 83: protective layer, L: light, L1: first light, L2: second light, 500: solar power generation apparatus

The invention claimed is:

1. A solar cell module comprising:
   a first electric power generation unit, and
   a second electric power generation unit; wherein
   the first electric power generation unit includes:
      a first light guide unit having a flat-plate shape, the first light guide unit emitting a first light from a side surface of the first light guide unit upon receipt of a first incident light that is incident from one surface of the first light guide unit, the first light having a first wavelength; and
      a first solar cell element provided at the side surface of the first light guide unit, the first solar cell element generating a first electric power by the first light emitted from the first light guide unit,
   the second electric power generation unit includes:
      a second light guide unit having a flat-plate shape, the second light guide unit emitting a second light from a side surface of the second light guide unit upon receipt of a second incident light that is incident from one surface of the second light guide unit, the second light having a second wavelength being different from the first wavelength; and
      a second solar cell element provided at the side surface of the second light guide unit, the second solar cell element generating a second electric power by the second light emitted from the second light guide unit,
   the one surface of the first light guide unit and the one surface of the second light guide unit are arranged to not overlap each other, and at least one of a shape and a dimension of the one surface of the first light guide unit is different from that of the one surface of the second light guide unit.

2. The solar cell module according to claim 1, wherein the first solar cell element has a first spectral sensitivity in accordance with the first wavelength, the first spectral sensitivity being different from a second spectral sensitivity in accordance with the second wavelength, the solar cell element having the second spectral sensitivity.

3. The solar cell module according to claim 1, wherein:
the first light guide unit includes a fluorescent material, and
the fluorescent material absorbs ultraviolet radiation and emits the first light.

4. The solar cell module according to claim 1, wherein:
the first electric power generation unit and the second electric power generation unit are arranged adjacent to each other, and
the one surface of first electric power generation unit and the one surface of the second electric power generation unit are oriented in a same direction.

5. The solar cell module according to claim 4, wherein:
a first periphery of the one surface of the first electric power generation unit has a substantially polygonal shape,
a second periphery of the one surface of the second electric power generation unit has a substantially polygonal shape, and
one side of the first periphery is adjacent to one side of the second periphery.

6. The solar cell module according to claim 4, wherein the one surface of the first light guide unit is parallel to the one surface of the second light guide unit.

7. The solar cell module according to claim 4, wherein the one surface of the first light guide unit is non-parallel to the one surface of the second light guide unit.

8. The solar cell module according to claim 1, wherein the first light guide unit comprises:
a main body unit having light transmission properties; and
a fluorescent layer disposed on a surface of the main body unit, the fluorescent layer containing a first fluorescent material.

9. The solar cell module according to claim 1, further comprising one or more protective layers having light transmission properties, the one or more protective layers being disposed on at least one of the one surface of the first light guide unit and the one surface of the second light guide unit.

10. The solar cell module according to claim 1, wherein the first solar cell element is provided between the side surface of the first light guide unit and the side surface of the second light guide unit, and wherein the second solar cell element is provided between the first solar cell element and the side surface of the second light guide unit.

11. The solar cell module according to claim 1, wherein the first electric power generation unit further comprises a reflection unit which reflects the first incident light toward the first solar cell element.

12. The solar cell module according to claim 1, wherein the one surface of the first light guide unit comprises a curved surface.

13. A solar power generation apparatus comprising:
a solar cell module, wherein
the solar cell module includes:
    first electric power generation unit, and
    a second electric power generation unit; wherein
the first electric power generation unit includes:
    a first light guide unit having a flat-plate shape, the first light guide unit emitting a first light from a side surface of the first light guide unit upon receipt of a first incident light that is incident from one surface of the first light guide unit, the first light having a first wavelength; and
    a first solar cell element provided at the side surface of the first light guide unit, the first solar cell element generating a first electric power by the first light emitted from the first light guide unit,
the second electric power generation unit includes:
    a second light guide unit having a flat-plate shape, the second light guide unit emitting a second light from a side surface of the second light guide unit upon receipt of a second incident light that is incident from one surface of the second light guide unit, the second light having a second wavelength being different from the first wavelength; and
    a second solar cell element provided at the side surface of the second light guide unit, the second solar cell element generating a second electric power by the second light emitted from the second light guide unit,
the one surface of the first light guide unit and the one surface of the second light guide unit are arranged to not overlap each other, and
at least one of a shape and a dimension of the one surface of the first light guide unit is different from that of the one surface of the second light guide unit.

* * * * *